(12) United States Patent
Caines et al.

(10) Patent No.: US 7,369,413 B2
(45) Date of Patent: May 6, 2008

(54) ELECTRONIC CONTROL ENCLOSURE

(75) Inventors: Arturo Caines, Hanover Park, IL (US);
Bratislav Kostic, Chicago, IL (US);
Thaddeus Michael John Rachwalski, Palos Hills, IL (US)

(73) Assignee: Cinch Connectors, Inc., Lombard, IL (US)

( * ) Notice: Subject to any disclaimer, the term of this patent is extended or adjusted under 35 U.S.C. 154(b) by 0 days.

(21) Appl. No.: 11/716,964

(22) Filed: Mar. 12, 2007

(65) Prior Publication Data
US 2007/0153485 A1 Jul. 5, 2007

Related U.S. Application Data

(62) Division of application No. 10/968,438, filed on Oct. 19, 2004, now Pat. No. 7,190,589.

(51) Int. Cl.
*H05K 7/20* (2006.01)
(52) U.S. Cl. ............ 361/719; 361/702; 361/704; 361/707; 165/80.2; 257/719
(58) Field of Classification Search ............. None
See application file for complete search history.

(56) References Cited

U.S. PATENT DOCUMENTS

| | | |
|---|---|---|
| 3,542,381 A | 11/1970 | Hait |
| 3,818,419 A | 6/1974 | Crane |
| 3,854,247 A | 12/1974 | Stark et al. |
| 4,047,242 A | 9/1977 | Jakob et al. |
| 4,298,905 A | 11/1981 | Bosler et al. |
| 4,442,450 A | 4/1984 | Lipschutz et al. |
| 4,521,829 A | 6/1985 | Wessely |

(Continued)

FOREIGN PATENT DOCUMENTS

DE 3440334 A1 5/1986

(Continued)

OTHER PUBLICATIONS

Product sheets entitled Electronic Packaging Capabilities by Deutsch Industrial Products, © 2001-2002.

(Continued)

*Primary Examiner*—Boris Chérvinsky
(74) *Attorney, Agent, or Firm*—Leydig, Voit & Mayer, Ltd.

(57) ABSTRACT

The electronic control enclosure includes devices and methods for removing heat energy from the electronic components of an electronic control unit. The components are mounted to a substrate and are protectively housed in an interior chamber of an environmentally sealed enclosure housing. Electrical communication is established with the components via a header assembly that includes plug receptacles. To remove heat generated by the components from the enclosure housing, one or more heat sinks are disposed through the enclosure housing such that the heat sinks have an interior surface exposed to the interior chamber and an exterior surface exposed to the exterior of the enclosure housing. In other embodiments, the enclosure housing may be made of a heat conductive material and the heat sink is integral with the enclosure housing. In one aspect, a spring urges the components against the interior surface. In another aspect, the components are mounted to and directly contact the interior surface.

17 Claims, 29 Drawing Sheets

U.S. PATENT DOCUMENTS

| | | | |
|---|---|---|---|
| 4,546,407 A | 10/1985 | Benenati | |
| 4,707,726 A | 11/1987 | Tinder | |
| 4,763,225 A | 8/1988 | Frenkel et al. | |
| 4,785,379 A | 11/1988 | Goodrich | |
| 4,853,828 A | 8/1989 | Penn | |
| 4,853,829 A | 8/1989 | Buzzelli | |
| 4,923,179 A | 5/1990 | Mikolajczak | |
| 4,972,294 A | 11/1990 | Moses, Jr. et al. | |
| 4,994,937 A | 2/1991 | Morrison | |
| 5,031,028 A | 7/1991 | Galich et al. | |
| 5,060,112 A | 10/1991 | Cocconi | |
| 5,060,113 A | 10/1991 | Jacobs | |
| 5,225,965 A | 7/1993 | Bailey et al. | |
| 5,272,593 A | 12/1993 | Jakob et al. | |
| 5,274,193 A | 12/1993 | Bailey et al. | |
| 5,280,410 A | 1/1994 | Klinger et al. | |
| 5,305,185 A | 4/1994 | Samarov et al. | |
| 5,305,215 A | 4/1994 | Brekkestran et al. | |
| 5,309,979 A | 5/1994 | Brauer | |
| 5,327,324 A | 7/1994 | Roth | |
| 5,402,313 A | 3/1995 | Casperson et al. | |
| 5,406,483 A | 4/1995 | Kallis et al. | |
| 5,450,284 A | 9/1995 | Wekell | |
| 5,454,767 A | 10/1995 | Clausen et al. | |
| 5,461,541 A | 10/1995 | Wentland, Jr. et al. | |
| 5,461,542 A | 10/1995 | Kosak et al. | |
| 5,526,232 A | 6/1996 | Kolberg et al. | |
| 5,526,261 A | 6/1996 | Kallis et al. | |
| 5,659,459 A * | 8/1997 | Wakabayashi et al. | 361/753 |
| 5,778,329 A | 7/1998 | Officer et al. | |
| 5,857,054 A | 1/1999 | Thomas et al. | |
| 5,946,192 A | 8/1999 | Ishigami et al. | |
| 6,043,981 A | 3/2000 | Markow et al. | |
| 6,055,158 A | 4/2000 | Pavlovic | |
| 6,094,349 A | 7/2000 | Fassel et al. | |
| 6,166,908 A * | 12/2000 | Samaras et al. | 361/700 |
| 6,185,100 B1 * | 2/2001 | Bentz et al. | 361/704 |
| 6,191,943 B1 | 2/2001 | Tracy | |
| 6,205,023 B1 | 3/2001 | Moribe et al. | |
| 6,222,732 B1 | 4/2001 | Jakob et al. | |
| 6,324,057 B1 | 11/2001 | Baran et al. | |
| 6,337,796 B2 * | 1/2002 | Yamada et al. | 361/719 |
| 6,341,063 B2 * | 1/2002 | Kinoshita et al. | 361/690 |
| 6,370,026 B2 * | 4/2002 | Sunaga et al. | 361/719 |
| 6,501,662 B2 | 12/2002 | Ikeda | |
| 6,515,858 B2 | 2/2003 | Rodriguez et al. | |
| 6,515,864 B2 | 2/2003 | Wakabayashi et al. | |
| 6,527,422 B1 | 3/2003 | Hutchison | |
| 6,578,984 B2 | 6/2003 | Chu et al. | |
| 6,583,986 B1 | 6/2003 | Stori et al. | |
| 6,678,159 B1 | 1/2004 | Barcley | |
| 6,781,840 B2 | 8/2004 | Ikushima et al. | |
| 6,788,539 B2 | 9/2004 | Skofljanec | |
| 6,972,959 B2 * | 12/2005 | Asai et al. | 361/719 |
| 7,050,305 B2 | 5/2006 | Thorum | |
| 7,175,313 B2 | 2/2007 | Bednara et al. | |

FOREIGN PATENT DOCUMENTS

| | | |
|---|---|---|
| DE | 43 44 629 A1 | 7/1994 |
| DE | 198 03 358 A1 | 8/1999 |
| EP | 0 400 434 A1 | 5/1990 |
| EP | 1 006 766 A2 | 11/1999 |
| FR | 2741503 | 5/1997 |
| FR | 2831384 | 4/2003 |
| JP | 62-252157 | 11/1987 |
| WO | WO 91/11897 | 8/1991 |

OTHER PUBLICATIONS

Photographs of enclosure by Sure Power, available approximately Sep. 2003.
Pages from www.surepower.com of Low Voltage Disconnect and Daytime Running Light Control, Sure Power Industries, Inc., © 2005.
U.S. Appl. No. 11/706,908, filed Feb. 13, 2007, Caines et al.
U.S. Appl. No. 11/716,915, filed Mar. 12, 2007, Caines et al.

* cited by examiner

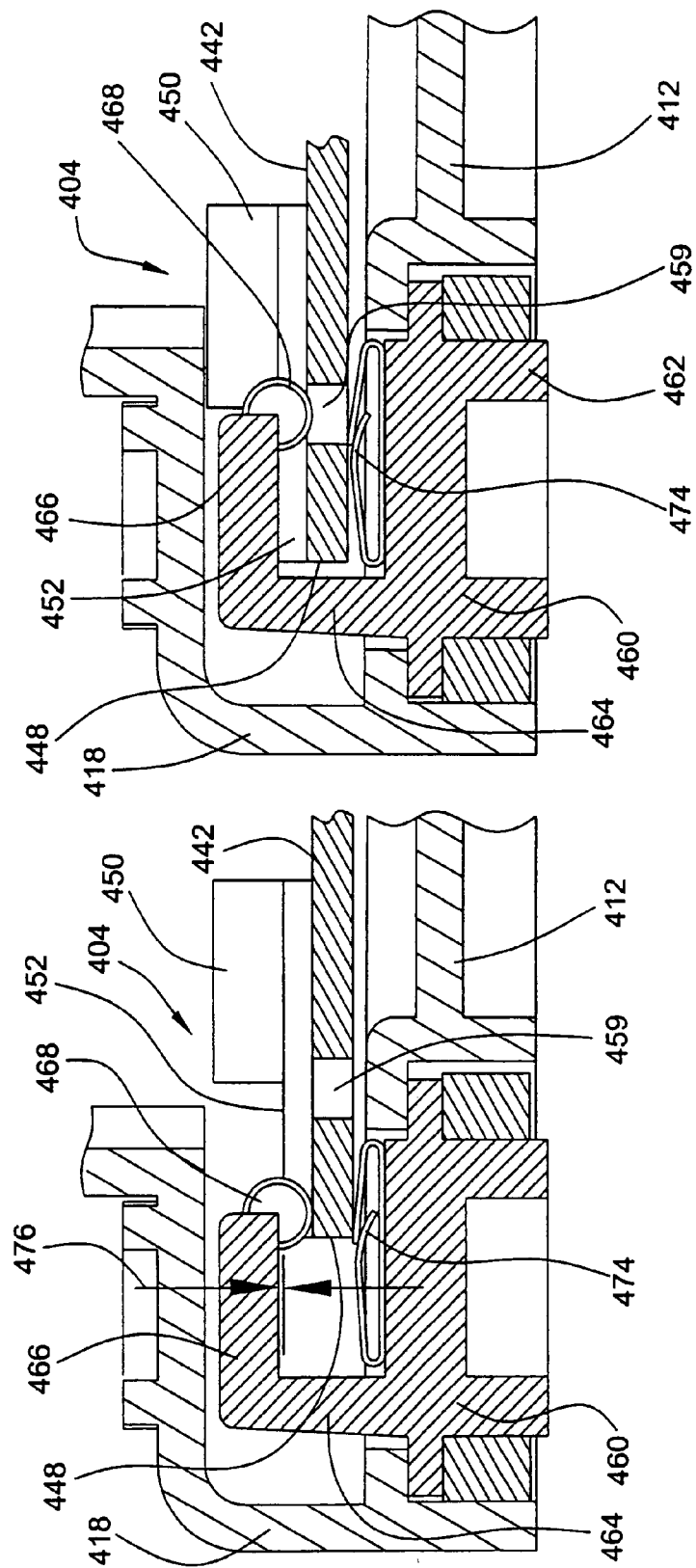

ELECTRONIC CONTROL ENCLOSURE

CROSS-REFERENCE TO RELATED APPLICATIONS

This patent application is a divisional of U.S. patent application Ser. No. 10/968,438, filed Oct. 19, 2004, now U.S. Pat. No. 7,190,589 which is incorporated by reference in its entirety herein.

FIELD OF THE INVENTION

This invention pertains generally to electronic control units and more particularly to an electronic control enclosure for housing the electronic components of an electronic control unit and that is configured to dissipate heat from within the enclosure.

BACKGROUND OF THE INVENTION

Electronic control units are typically used in various applications to control electronic or electrical devices and, accordingly, are made of many electronic components. Often, the electronic components are mounted to a printed circuit board to both establish electrical communication between the components and to keep the components in a tightly grouped assembly. To protect the electronic components from damage due to impact with external objects and to simplify distribution and attachment of the electronic control unit, the components are also often housed in a protective enclosure housing.

In some applications, the electronic control unit is required to be placed in a particularly harsh environment. For instance, the electronic control unit may be placed in or on an automobile or similar transportation mechanism to control, for example, the timing and operation of the engine. Such applications may expose the electronic control unit to airborne dirt and grime that, if allowed to enter the enclosure housing, could damage the electronic components. Therefore, it is often desirable that the enclosure housing be environmentally sealed. However, because the electronic components located in the enclosure housing typically generate heat energy during operation that could potentially damage the components, measures must be taken to cool the components.

BRIEF SUMMARY OF THE INVENTION

The invention provides an electronic control enclosure for protectively housing and removing heat energy from the components of an electronic control unit. The electronic control enclosure includes an enclosure housing that defines an interior chamber in which the electrical components can be protectively placed. To establish electrical communication between the electrical components and one or more external electrical sources, the electronic control enclosure also includes a header assembly and a substrate assembly. The header assembly includes a front plate into which receptacles are formed that can receive electrical cables and plugs from the external sources. Attached to the header assembly is a substrate of the substrate assembly that has conductive traces formed thereon. Mounted to the substrate in an integrated fashion are various elements that make up the electronic control unit. Among these elements are electronic components that, because they generate heat energy during their operation, include exposed heat transfer surfaces for dissipating the heat energy. An example of such electronic components are discrete transistors such as MOSFET devices.

To remove the generated heat from the electronic components, in one aspect of the invention, the electronic control unit includes a heat sink having both an interior surface exposed to the interior chamber and an exterior surface exposed at the exterior of the enclosure housing. The heat sink can be disposed through the enclosure housing. In other embodiments, the enclosure housing may be made of a heat conductive material, such as metal, and the heat sink is integral with the enclosure housing. When the header assembly is inserted into the interior chamber, the electronic components mounted to the substrate align along the heat sink. To ensure that heat energy is adequately transferred from the electronic components to the heat sink and thereby removed from the interior chamber to the exterior surface, a spring is located within the interior chamber that urges the heat transfer surfaces toward the interior surfaces.

In another aspect of the invention, the heat sink can be formed as part of the header assembly. The electronic components are mounted to or otherwise in direct contact with the heat sink. The substrate, with its electrical traces, is also attached to the header assembly and electrical communication is established between the electronic components and the substrate. Once the header assembly is inserted into the interior chamber, heat generated from the electronic components is transferred via the heat sinks to the exposed portions of the header assembly where the heat energy is dissipated to the exterior environment.

An advantage of the invention is that it provides an electronic control enclosure for protectively enclosing the electronic components of an electronic control unit. Another advantage is that the invention removes heat energy generated by the electronic components and transfers that heat energy to the exterior of the electronic control enclosure. Another advantage is that the invention is configured to improve the transfer of heat energy between an exposed heat transfer surface of the electronic components and a heat sink. These and other advantages and features of the invention will become apparent from the foregoing detailed description and drawings.

BRIEF DESCRIPTION OF THE DRAWINGS

FIG. 23 is a detailed view of the indicated area of FIG. 22 illustrating the substrate assembly as substantially inserted in the enclosure housing to a pre-load position.

FIG. 24 is a detailed view of the indicated area of FIG. 22 illustrating the substrate assembly as fully inserted in the enclosure housing to a loaded position.

DETAILED DESCRIPTION OF THE INVENTION

Figure 1:
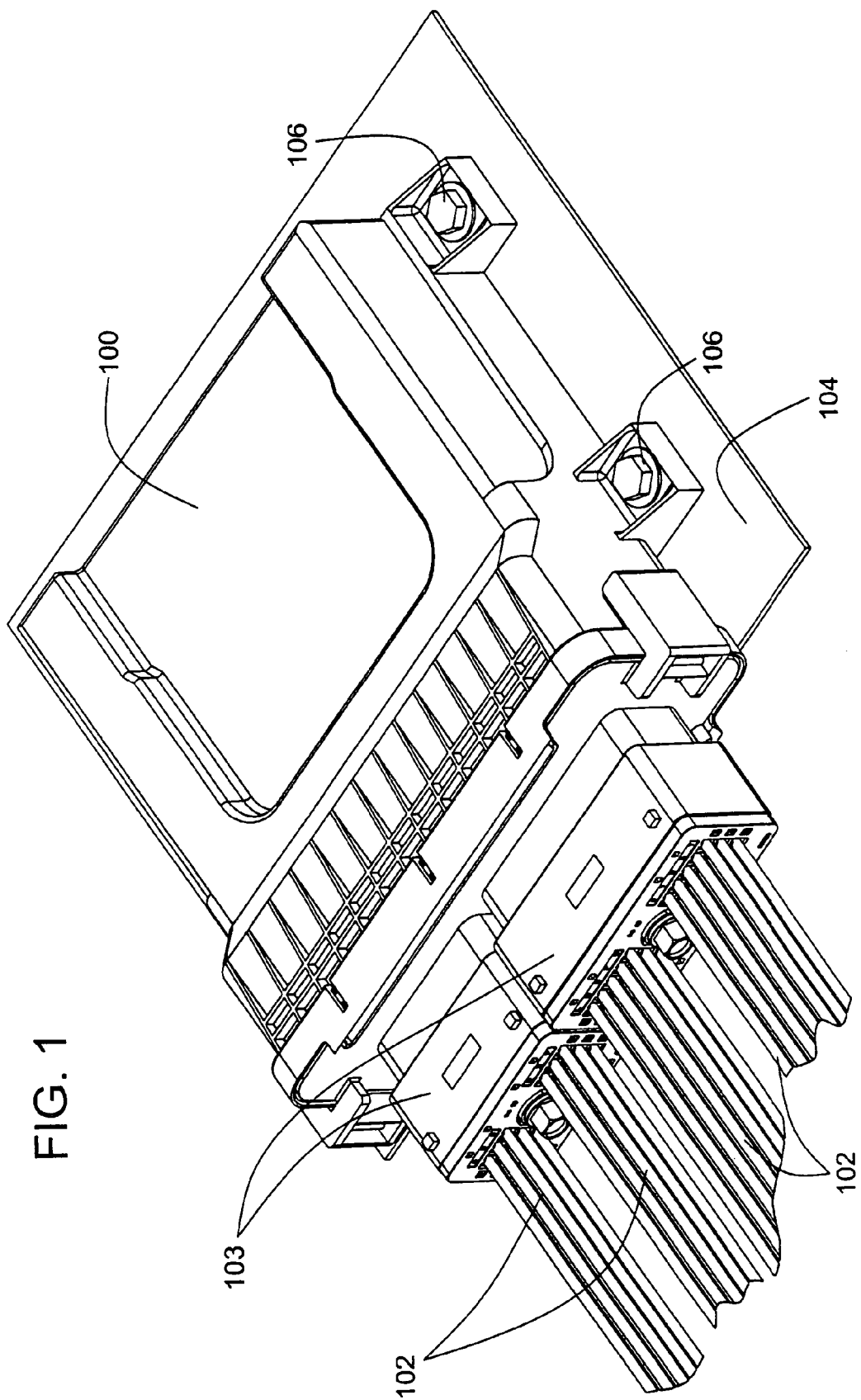
FIG. 1 is a top perspective view of an electronic control enclosure for protectively housing the electronic components of an electronic control unit, including two plugged-in cables.
Figure 2:
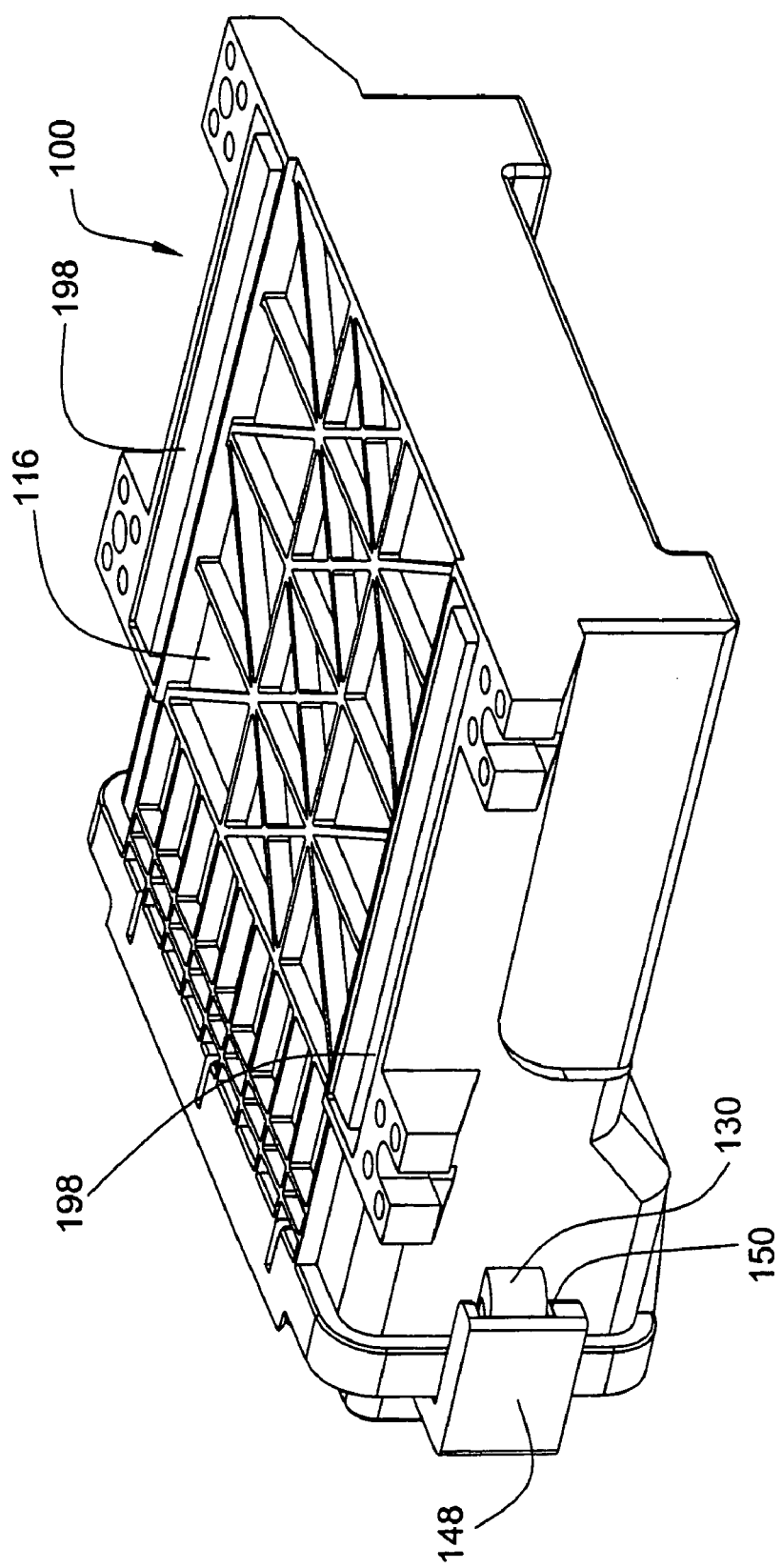
FIG. 2 is a bottom perspective view of the electronic control enclosure of FIG. 1, illustrating the exterior surfaces of two heat sinks for transferring heat from an interior chamber.
Figure 3:
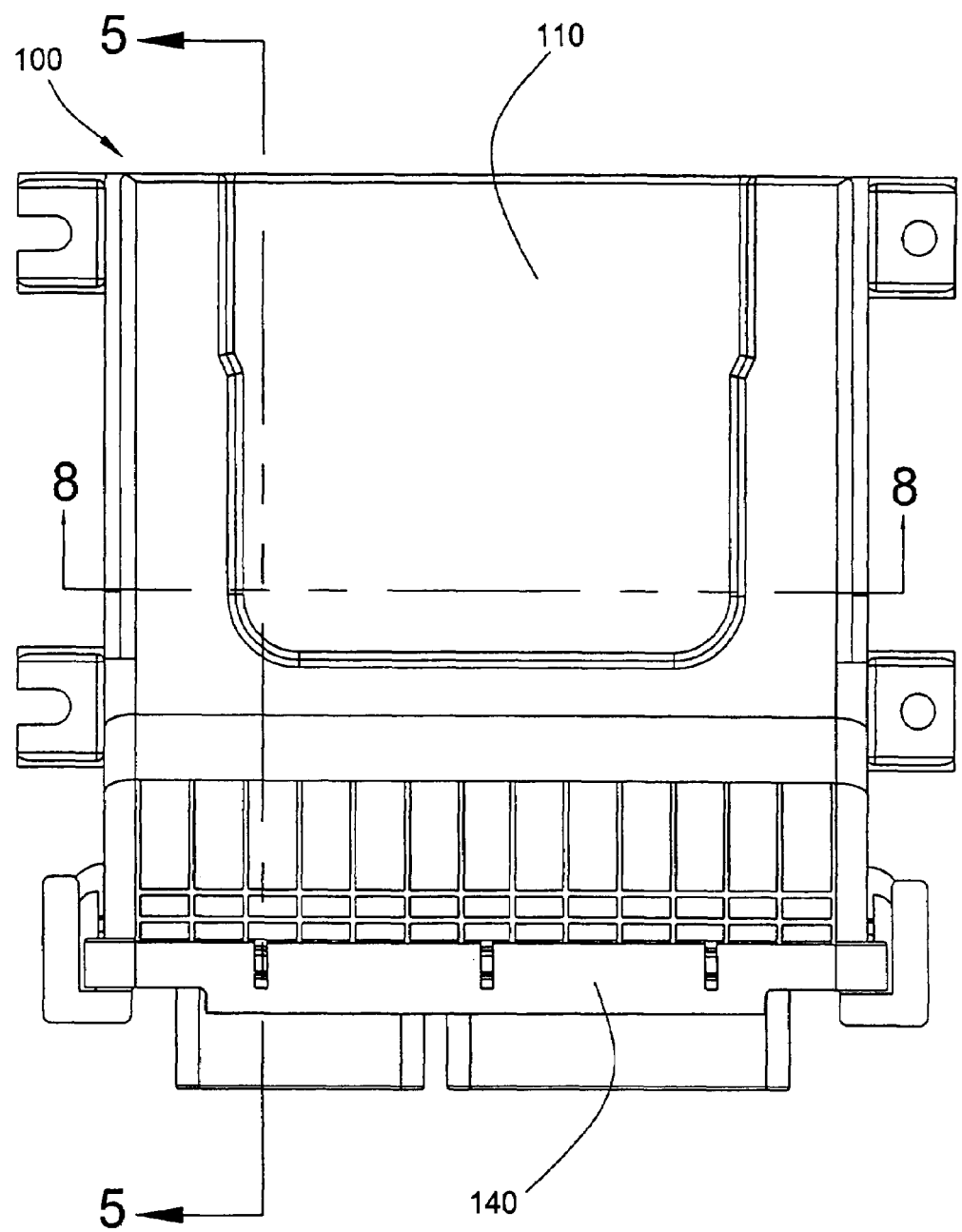
FIG. 3 is a top plan view of the electronic control enclosure of claim 1.

Now referring to the drawings, wherein like reference numbers refer to like elements, there is illustrated in FIGS. 1, 2 and 3 the exterior of an embodiment of an electronic control enclosure 100 for an electronic control unit designed in accordance with the teachings of the invention. The electronic control unit can be used to control externally situated electrical devices. The electrical elements and components making up the electronic control unit are located in the interior of the electronic control enclosure 100, where they are protected from the exterior environment. To establish communication between the internal elements and components and the externally situated electrical devices, one or more electrical cables 102 that terminate in plugs 103 are plugged into the electronic control enclosure 100.

The electronic control enclosure 100 can be secured to a panel 104 situated proximate to the external electrical devices with one or more fasteners 106, though, in other embodiments, the electronic control enclosure can be secured by other appropriate securing methods. Referring to FIGS. 1, 2, and 3, the electronic control enclosure 100 preferably has a generally overall rectangular shape with a low profile so that the electronic control unit will not interfere with other devices situated the surrounding environment. Because the elements and components making up the electronic control unit are protectively housed in the electronic control enclosure 100, the electronic control unit can be secured within harsh or dirty environments, such as the engine compartment of an automobile.

Figure 4:
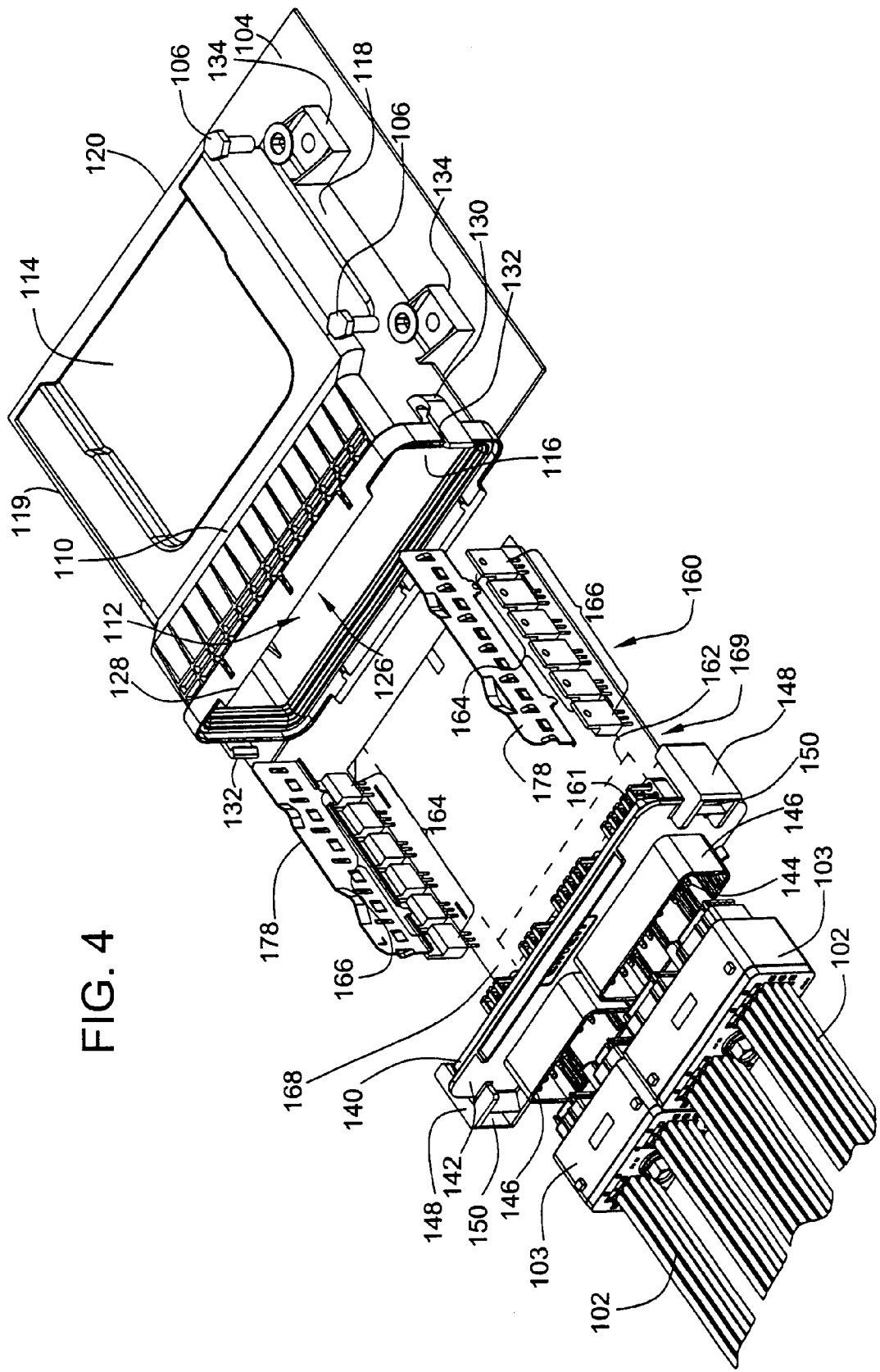
FIG. 4 is an exploded view of the electronic control enclosure of claim 1, illustrating the parts of the control enclosure including the electronic components.

Illustrated in FIG. 4 are the various parts that make up the electronic control enclosure 100. To define an interior chamber 112 for the electronic components, an enclosure housing 110 is provided. The enclosure housing 110 has a top wall 114, an opposing bottom wall 116, and first and second sidewalls 118, 119 that extend between the top and bottom walls 114, 116. The top, bottom, and sidewalls are integrally joined and arranged generally orthogonally with each other to produce the rectangular shape of the electronic control enclosure. To enclose the interior chamber 112, a rear wall 120 extends adjacent to and is likewise integrally joined with the top, bottom, and sidewalls. As will be appreciated, the terms "top," "bottom," "side," and "rear" are exemplary only and are not intended to limit the orientation of the enclosure housing or the electronic control enclosure in any way.

The enclosure housing can be made from any suitable material such as, for instance, molded plastic that preferably demonstrates corrosion resistant properties. To shield the components of the electronic control unit that are housed in the interior chamber from electrical-magnetic interference, the inner surfaces of the top, bottom, side, and rear walls can be coated with an EMI shielding material. In other embodiments, the enclosure housing can be made from a metallic material.

To access the interior chamber, the portion of the enclosure housing 110 opposite the rear wall 120 is formed as an opening 126. The opening 126 is defined by a rectangular rim 128 that is formed by the forward-most edges of the top, bottom, and sidewalls 114, 116, 118, 119. Extending from either sidewall 118, 119 and projecting forward of the rim 128 are cantilevered latch arms 130 that terminate in inclined barbs 132. To secure the electronic enclosure housing to the panel, there is projecting from either sidewall 118, 119 proximate to the bottom wall 116 one or more mounting feet 134 through which the fasteners 106 can be inserted.

To enclose the opening 126 while establishing electronic communication with the interior chamber 112, the electric control enclosure also includes a header assembly 140. The header assembly 140 has a generally planar front plate 142 that is sized to be received in the opening 126 and constrained within the rim 128. One or more electrical terminals 144 extend through the front plate 142 and are retained by the front plate in a predetermined arrangement. To protect the external portions of the terminals 144 from damage and to appropriately align the plugs 103 with the arranged terminals, there extend from the front plate 142 one or more receptacle walls 146 that surround the terminals.

The front plate 142 and receptacle walls 146 can be manufactured from any suitable material, such as plastic, cast aluminum or magnesium. To fasten the header assembly 140 to the enclosure housing 110, there are extending from either side of the front plate 142 latch catches 148. When the front plate 142 is aligned with the rim 128 that defines the opening 126, the latch catches 148 likewise align with the latch arms 130. Referring to FIGS. 2 and 4, as the header assembly 140 and enclosure housing 110 are moved together, the cantilevered latch arms 130 are received in and extend through slots 150 defined by the latch catches 148. The latch catches 148 and the inclined barbs 132 at the end of the latch arms 130 are configured to initially deflect the cantilevered latch arms outward from the sidewalls 118, 119. However, once the front plate 142 is constrained within the rim 128, it will be appreciated that the inclined barbs 132 extend around and hook onto the latch catches 148, thereby retaining the header assembly and enclosure housing together. It will be appreciated that by using the appropriate tools, the inclined barbs 132 can be unhooked from the latch catches 148 to remove the header assembly from the enclosure housing. It will further be appreciated that in other embodiments, the latch arms can be included on the front plate and the latch catches can be included on the enclosure housing.

Figure 5:
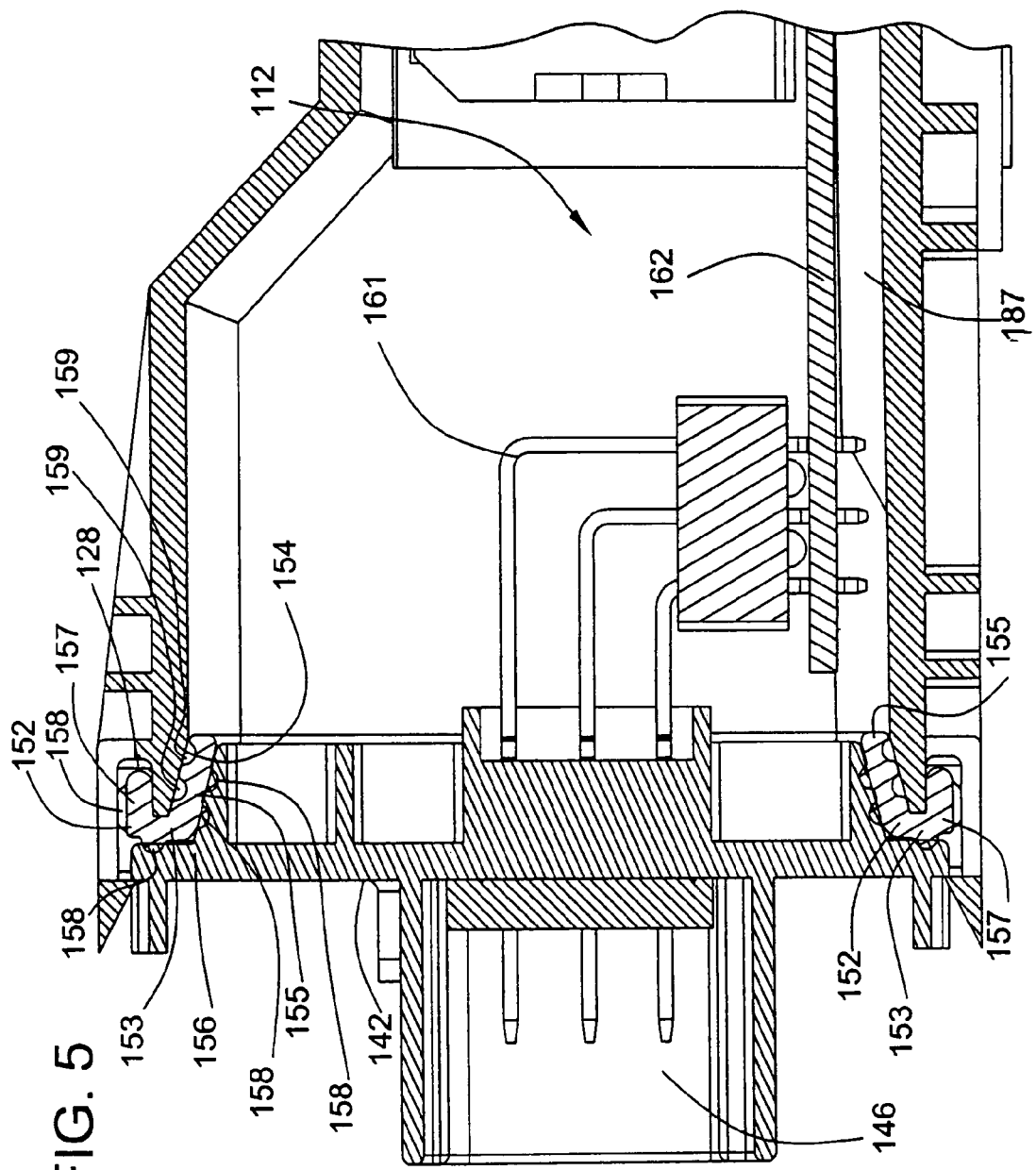
FIG. 5 is a cross-sectional view taken along line 5-5 of FIG. 3 illustrating a header assembly environmentally sealing an enclosure housing.

To environmentally seal the interior chamber 112 when the header assembly and enclosure housing are retained together, referring to FIG. 5, a peripheral seal 152 is included between the front plate 142 and rim 128. The peripheral seal 152 can be made from any suitable material; such as a natural or elastomeric rubber. To facilitate the setting and engagement of the peripheral seal 152, the rim 128 is formed with a seating surface 154 that may invertedly slope rearward into the interior chamber 112. The seal 152 may have a C-shaped cross-section which includes a center portion 153, an inner leg 155 and an outer leg 157. The seal 152 may include protrusions 158 and/or recesses 159 which assist in creating a seal between the housing and the front plate. The peripheral seal may be placed against the rim of the enclosure housing before the front plate and the enclosure housing are retained together. The seal 152 fits over the seating surface 154 and the inner rim of the housing. The front plate 142 includes a complementary boss 156 projecting from the side of the front plate opposite the receptacle walls 146. The boss 156 may slope rearward into the interior chamber 112. As will be appreciated, when the front plate 142 is set within the rim 128, the peripheral seal 152 is compressed between the boss 156 and the seating surface 154. Because the interior chamber is environmentally sealed, dirt and grime from the exterior environment cannot enter the enclosure housing.

Referring to FIG. 4, to mount and interconnect the various electronic components of the electronic control unit, the electronic control enclosure includes a substrate assembly 160. The substrate assembly 160 is arranged around a substrate 162, such as a printed circuit board, on which electrically conductive circuit traces are formed. The substrate 162 has a generally planar shape with opposing first and second surfaces 168, 169. The substrate 162 can be rigidly attached to the header assembly 140 so as to extend rearwardly from the lower edge of the front plate 142.

As illustrated in FIGS. 4 and 5, to establish electrical communication between the cables from the external devices and the substrate assembly 162, the terminals 144 include terminal leads 161 on the rear side of the front plate 142 that are formed with right angles directing the terminals toward the substrate. The terminal leads 161 are soldered to and make electrical contact with the conductive circuit traces on the substrate 162. To prevent cross-talk or inductive interference between the terminals 144, in an embodiment, the header assembly 140 can also include an inductive ferrite filter block through which the terminal leads 161 pass. As will be appreciated by those of skill in the art, the filter block physically separates the terminals leads while it simultaneously shields the terminals from electromagnetic and inductive interference.

The electronic components that make up the electronic control unit are mounted to the substrate 162 so that the electronic components are in electrical communication with the conductive circuit traces. A typical electronic component included in the electronic control unit is a discrete transistor that, as is familiar to those of skill in the electronics arts, functions as an electrical switch. One type of transistor particularly well-suited for the electronic control unit is a metal-oxide semiconductor field effect transistor (MOSFET). The MOSFET includes one or more leads, such as a gate, source, or drain lead, that are soldered to lead holes disposed into the substrate 162. Referring to FIG. 4, because such MOSFET devices 164 generate heat energy during their operation that, if not removed, could adversely effect and possibly damage the MOSFET device, the MOSFET device may be provided with an exposed heat transfer surface 166 made of a thermally conductive material.

Figure 6:
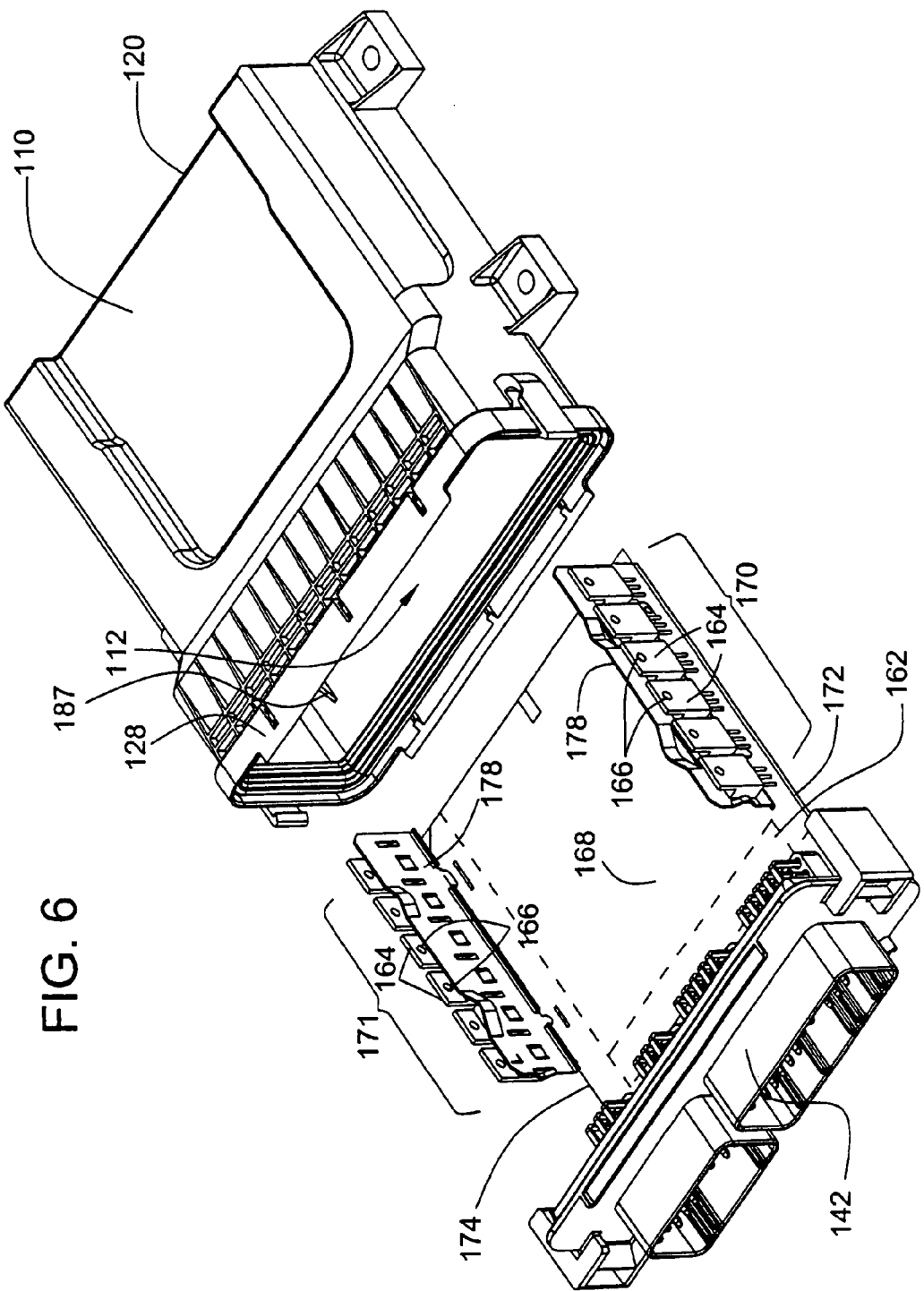
FIG. 6 is a perspective view of the electronic control enclosure of FIG. 1, illustrating the header assembly and an attached substrate assembly being inserted into the enclosure housing.

Referring to FIG. 6, in the illustrated embodiment, the MOSFET devices 164 project upright from the first surface 168 and are arranged in two rows 170, 171 extending from approximately near the front plate 142 rearward. The rows 170, 171 are aligned along a first and second side-edge 172, 174 of the substrate 162 such that the heat transfer surfaces 166 are directed outward. Within the rows 170, 171, the MOSFET devices 164 are generally spaced-apart from each other.

Figure 7:
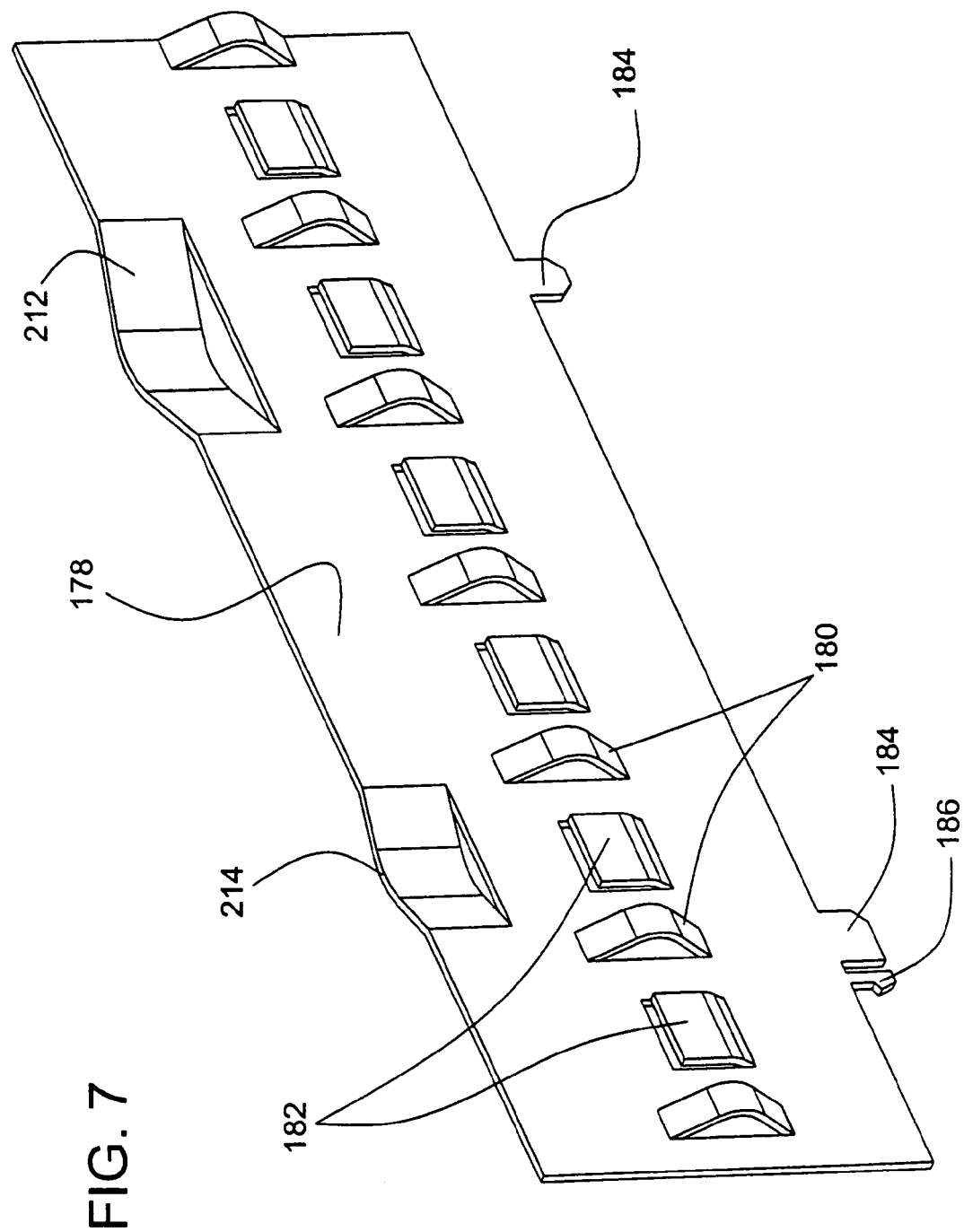
FIG. 7 is a perspective view of a spring plate for urging the electronic components against heat sinks in the electronic control enclosure of FIG. 1.

Also included as part of the substrate assembly 160, as illustrated in FIGS. 4 and 6, are one or more spring plates 178 that are mounted to the substrate 162. Referring to FIG. 7, the spring plate 178 is a generally planar, elongated structure that can be made from any suitable material, such as stamped sheet metal. To keep the MOSFET devices spaced-apart, the spring plate 178 includes multiple spacer elements 180 that extend along the length of the spring plate. The width of the spacer elements 180 is approximately equal to the distance the MOSFET devices are spaced-apart, while the distance between the spacer elements is approximately equal to the width of a MOSFET device. Located between the spacer elements 180 and designed to individually contact the MOSFET devices are a plurality of engagement elements 182 that are also formed into the spring plate 178.

As illustrated in FIG. 6, when mounted to the substrate 162, the spring plates 178 extend along the rows 170, 171 of MOSFET devices 164 with the spacer elements and holder elements appropriately engaging the MOSFET devices. Referring to FIG. 7, to mount the spring plate 178 to the substrate 162, one or more attachment prongs 184 extend from the spring plate 178 that can be received within complementary slots disposed into the substrate. One of the attachment prongs 184 can also include a locking prong 186 for locking the spring plate 178 in an upright position on the substrate 162.

Figure 8:
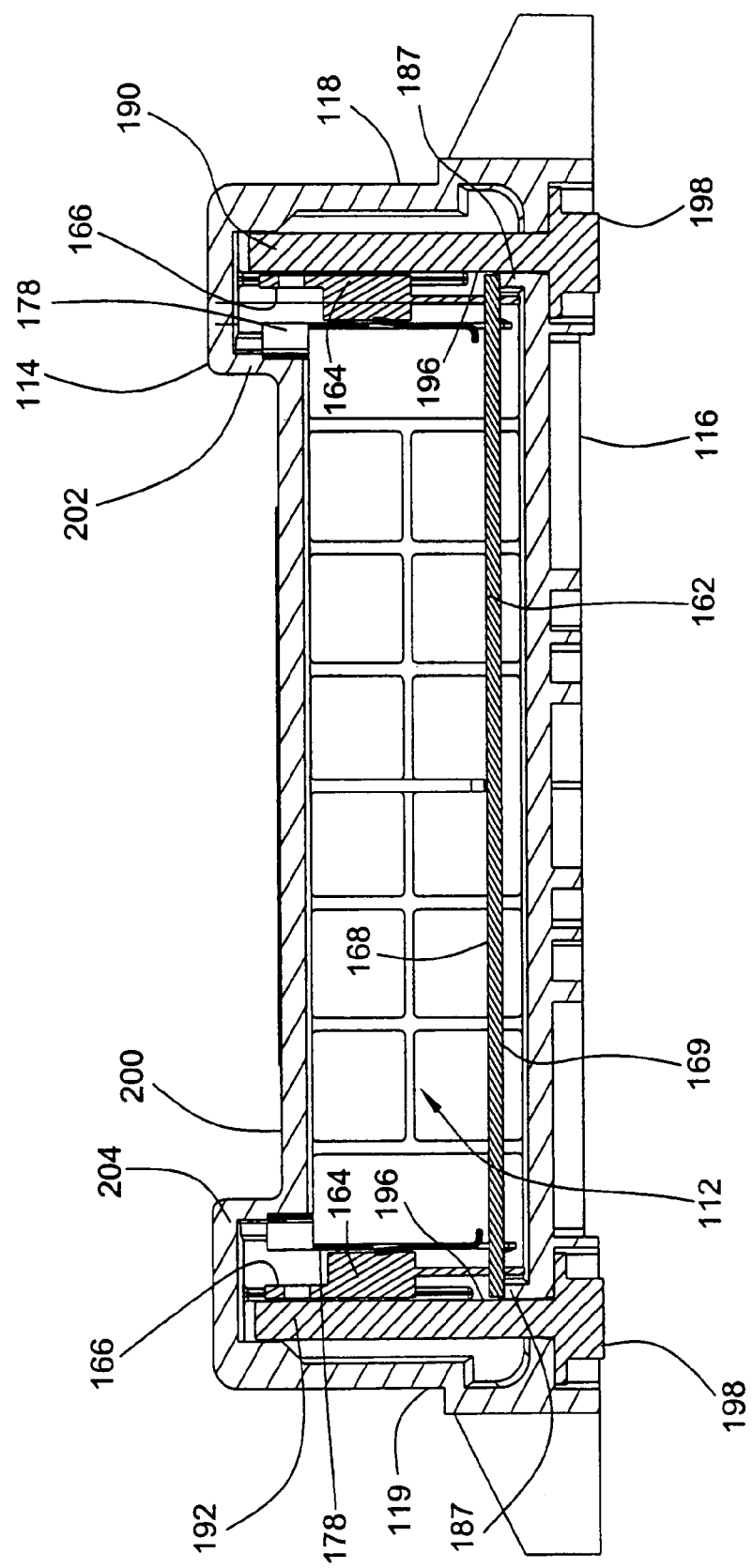
FIG. 8 is a cross-sectional view of the electronic control enclosure taken along line 8-8 of FIG. 3.

As illustrated in FIG. 6, to place the MOSFET devices 164 in the interior chamber 112 so that they are protectively enclosed within the enclosure housing 110, the substrate assembly 160 is inserted through the opening 112 toward the rear wall 120 until the front plate 142 engages against the rim 128. The housing 110 may include raised surfaces or rails 187, 189 to support the substrate 162 as shown in FIGS. 5, 6 and 8. Referring to FIG. 8, once inserted into the interior chamber 112, the substrate 162 extends orthogonally between the first and second sidewalls 118, 119 with the first surface 168 opposing and spaced-apart from the top wall 114 and the second surface 169 opposing the bottom wall 116. Because of the sealing engagement between the header assembly and the opening, the electronic components 164 are all environmentally sealed within the interior chamber 112.

Attaching the peripheral seal to the rim prior to engaging the front plate-with the enclosure housing, as described above, facilities assembly of the substrate assembly by enabling reflow or wave soldering. Specifically, as will be appreciated by those of skill in the art, the terminal leads from the header assembly and the electronic components are mounted to the circuit traces on the substrate. The header assembly and substrate assembly may then be subjected to the reflow or wave soldering operation that permanently mounts the terminal leads and electrical components to the substrate in such a manner as to establish electrical communication between the various parts. Because the peripheral seal is safely mounted on the enclosure housing which does not undergo the soldering process, the peripheral seal will remain undamaged.

To remove heat energy from the electronic components and thereby prevent overheating of the sealed interior chamber, in accordance with an aspect of the invention, the enclosure housing includes one or more heat sinks. In the embodiments where the enclosure housing is plastic, the heat sinks may be disposed through the enclosure housing. In the embodiments with the plastic housings, the heat sinks are made from an appropriate, thermally-conductive material such as aluminum, magnesium, zinc, or alloys thereof, or a heat conductive plastic and are arranged in the enclosure housing so as to conduct heat energy from the interior chamber to the exterior environment. In the embodiments where the enclosure housing is heat conductive material, such as metal, the heat sinks may be integral with the enclosure housing. The heat conductive material may be aluminum, magnesium, zinc, or alloys thereof, or a heat conductive plastic.

Figure 9:
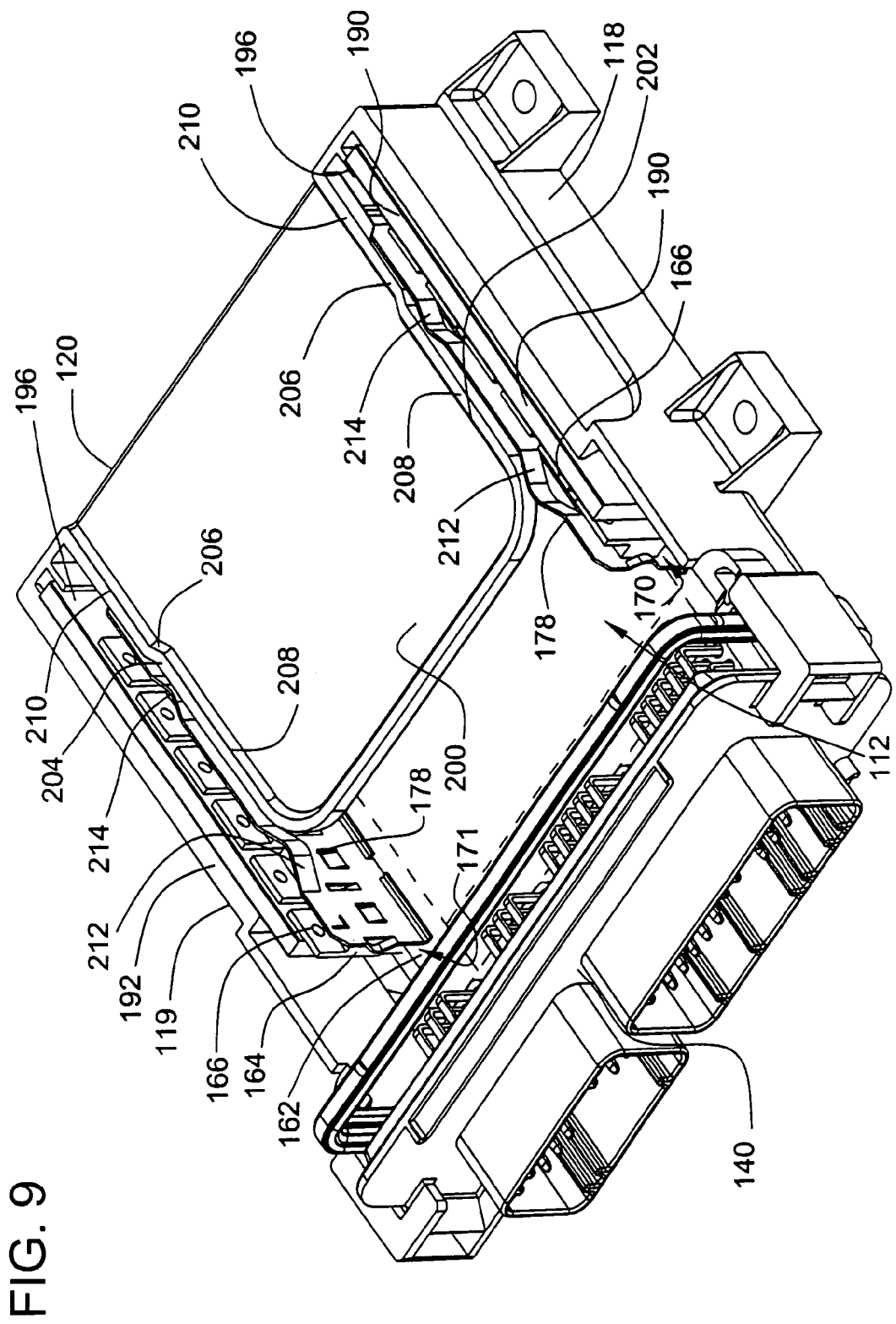
FIG. 9 is a top perspective view of the electronic control enclosure with the top wall removed and the header assembly and substrate assembly substantially inserted to a pre-load position.
Figure 10:
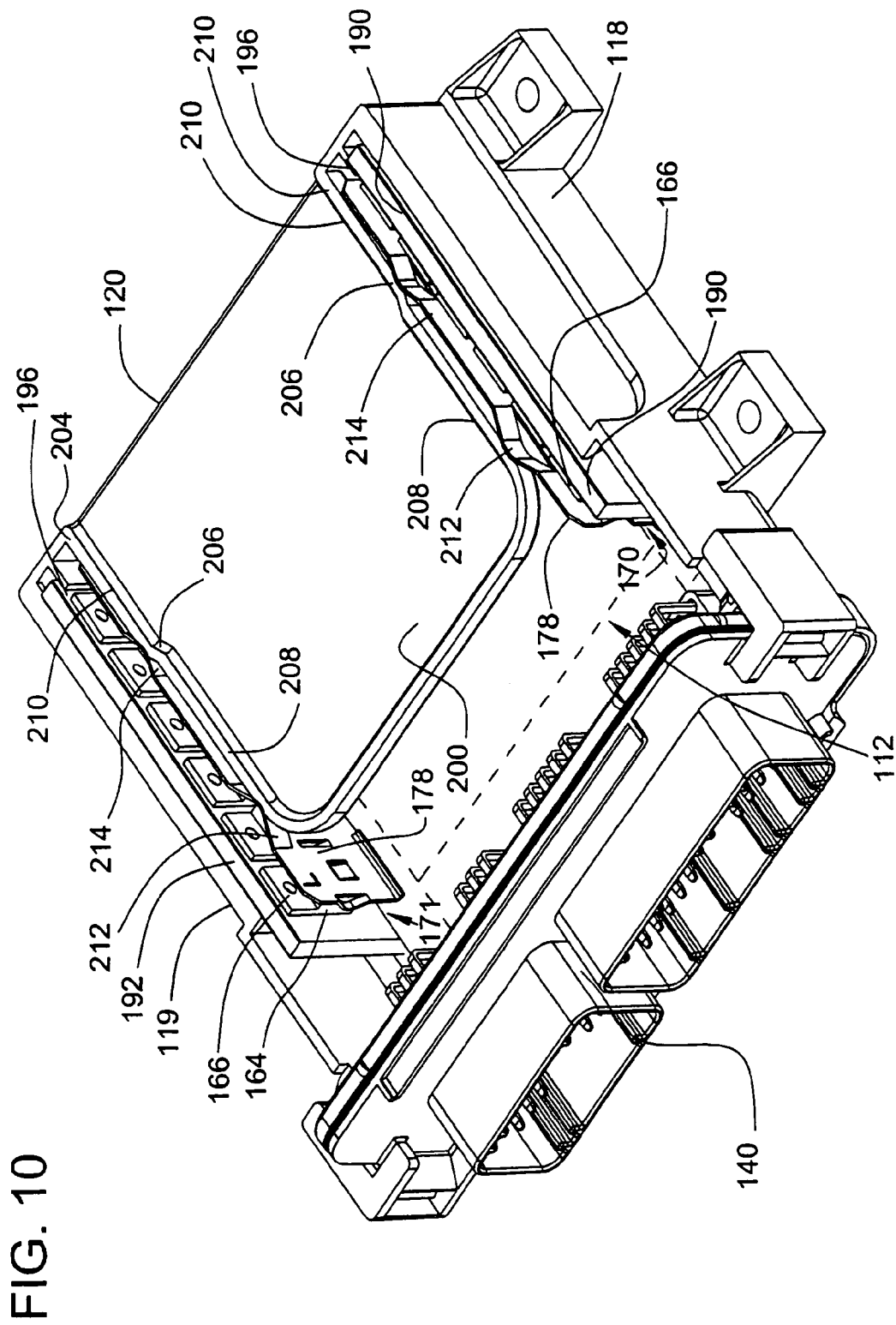
FIG. 10 is a top perspective view of the electronic control enclosure with the top wall removed and the header assembly and substrate assembly fully inserted to a loaded position.

Referring to FIG. 8, there is illustrated a first and a second heat sink 190, 192 that are disposed through the bottom wall 116 and therefore are partially located within the interior chamber 112. Accordingly, the heat sinks 190, 192 each include an interior surface 196 that is exposed within the interior chamber 112 and an exterior surface 198 that is exposed along the exterior of the bottom wall 116, as illustrated in FIGS. 2 and 8. Referring to FIGS. 8, 9, and 10, the elongated first and second heat sinks 190, 192 extend along the height of first and second sidewalls 118, 119 such that the interior surfaces 196 oppose each other across the substrate 162. To accommodate and retain the heat sinks 190, 192, slots can be formed through the bottom wall 120 to which the heat sinks are adhered with epoxy.

Referring to FIGS. 6 and 8, due to the arrangement of the MOSFET devices 164 along the first and second edges 172, 174 of the substrate 162, when the substrate assembly is inserted into the interior chamber 112, the rows 170, 171 of MOSFET devices align with the elongated heat sinks 190, 192. Moreover, the exposed heat transfer surfaces 166 of the MOSFET devices oppose and are adjacent to the interior surfaces 196 of the heat sinks 190, 192. Heat energy generated by the MOSFET devices 164 is thereby conducted from the heat transfer surfaces 166 through the heat sinks 190, 192 to the exterior surfaces 198.

To ensure that the thermal energy is adequately transferred from the electronic components 164 to the heat sinks 190, 192, in accordance with another aspect of the invention, the spring plates 178 can urge the MOSFET devices 164 toward the interior surfaces 196. To make the spring plates 178 urge the MOSFET devices 164, referring to FIGS. 8, 9, and 10, the enclosure housing 110 includes an embossment 200 projecting into the interior chamber 112. In the illustrated embodiment, the embossment 200 projects from the top wall 114 towards the bottom wall 116 and can be formed when the enclosure housing is molded. The embossment 200 includes a first edge 202 that is oriented toward and spaced-apart from the first sidewall 118 and further includes a second edge 204 that is oriented toward and spaced-apart from the second sidewall 119. Furthermore, the first and second edges 202, 204 extend generally parallel to the first and second sidewalls 118, 119.

When the substrate assembly is inserted into the interior chamber, as illustrated in FIG. 8, the MOSFET devices 164 are located in the spaces between the first and second edges 202, 204 and the first and second sidewalls 118, 119. The embossment 200 contacts the spring plates 178 urging the spring plates toward the respective first and second sidewalls 118, 119. Because of the arrangement of the MOSFET devices 164 on the substrate 162, the heat transfer surfaces 166 are urged against the interior surfaces 196 of the heat sinks 190, 192 thereby ensuring that the generated heat energy is adequately transferred.

To insert the substrate assembly into the interior chamber 112 without damaging the MOSFET devices 164, the embossment 200 and spring plates 178 are configured to only engage each other after the substrate assembly is fully inserted to a loaded position. To accomplish this, as illustrated in FIGS. 9 and 10, the first and second edges 202, 204 both include a step 206 that divides the first and second edges into first and second edge portions 208, 210. The first edge portion 208 is spaced a greater distance from the first and second sidewalls 118, 119 than the second edge portion 210 is spaced. Moreover, the first edge portion 208 is spaced from the rear wall 120 while the second edge portion 210 is proximate to the rear wall. Additionally, referring to FIG. 7, the spring plate 178 also includes first and second compression features 212, 214 that protrude from the spring plate 178. Moreover, the first compression feature 212 protrudes further from the plane of the spring plate 178 than the second compression feature 214, with the first compression feature oriented further forward on the spring plate than the second compression feature. The first and second compression features can be formed by displacing a portion of the spring plate through a stamping operation.

Referring to FIG. 9, it will be appreciated that as the substrate assembly is inserted, the smaller second compression feature 214 is loosely received in the gap between the first edge portion 208 and the respective sidewall. This position is known as the pre-load position, which exists over a substantial range of insertion of the substrate assembly, wherein the embossment and spring plate do not significantly urge the MOSFET devices toward the heat sinks. Accordingly, as will be familiar to those of skill in the art, the electronic control enclosure demonstrates a zero insertion force effect in which no substantial resistance is encountered during insertion of the substrate assembly to the preload position. However, referring to FIG. 10, as the second compression feature 214 passes over the step 206 and engages the second edge portion 210, the spring plate 178 is directed toward the respective sidewall and against the MOSFET devices 164. Additionally, once the substrate assembly is fully inserted, the larger first compression feature 212 engages the first edge portion 208 likewise causing the spring plate 178 to urge the MOSFET devices 164 against the heat sinks 190, 192. This is known as the loaded position, wherein once the substrate assembly is fully-inserted, the embossment and spring plate significantly urge the MOSFET devices towards the heat sinks.

Because the MOSFET devices 194 contact the heat sinks 164 after the compression features and edge portions have engaged, destructive sliding of the heat transfer surfaces 166 over the interior surfaces 196 is reduced. The edge portions and compression features can be configured to engage only over the last 0.1 inches of insertion. In an embodiment, to assist in transferring heat energy away from the MOSFET devices, a thermal conducting paste, adhesive, or pad can be placed between the heat transfer surfaces and the interior surfaces. Thermal conducting paste or pads may further reduce the destructive sliding.

Figure 29:
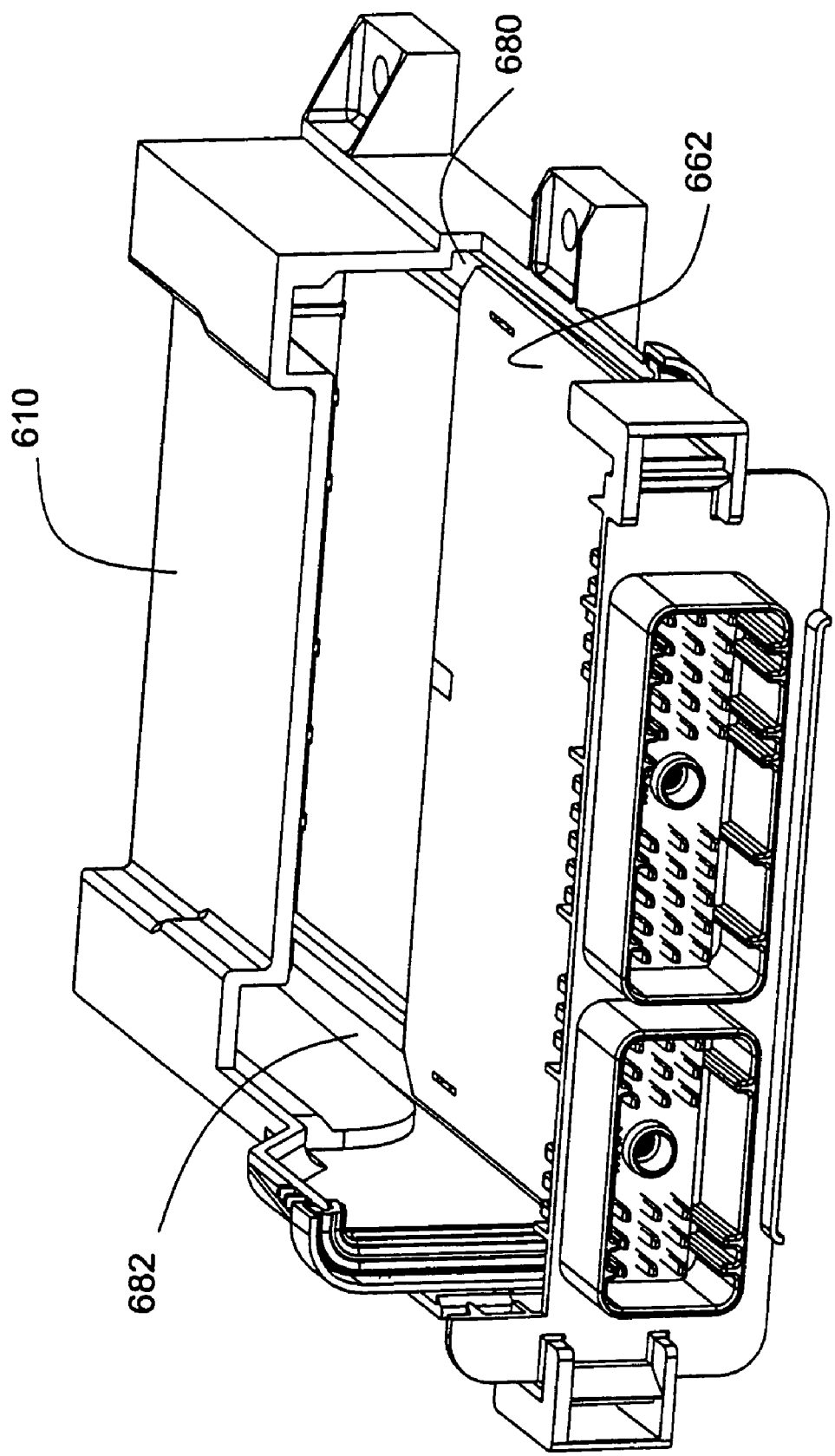
FIG. 29 is a perspective view of another embodiment.
Figure 30:
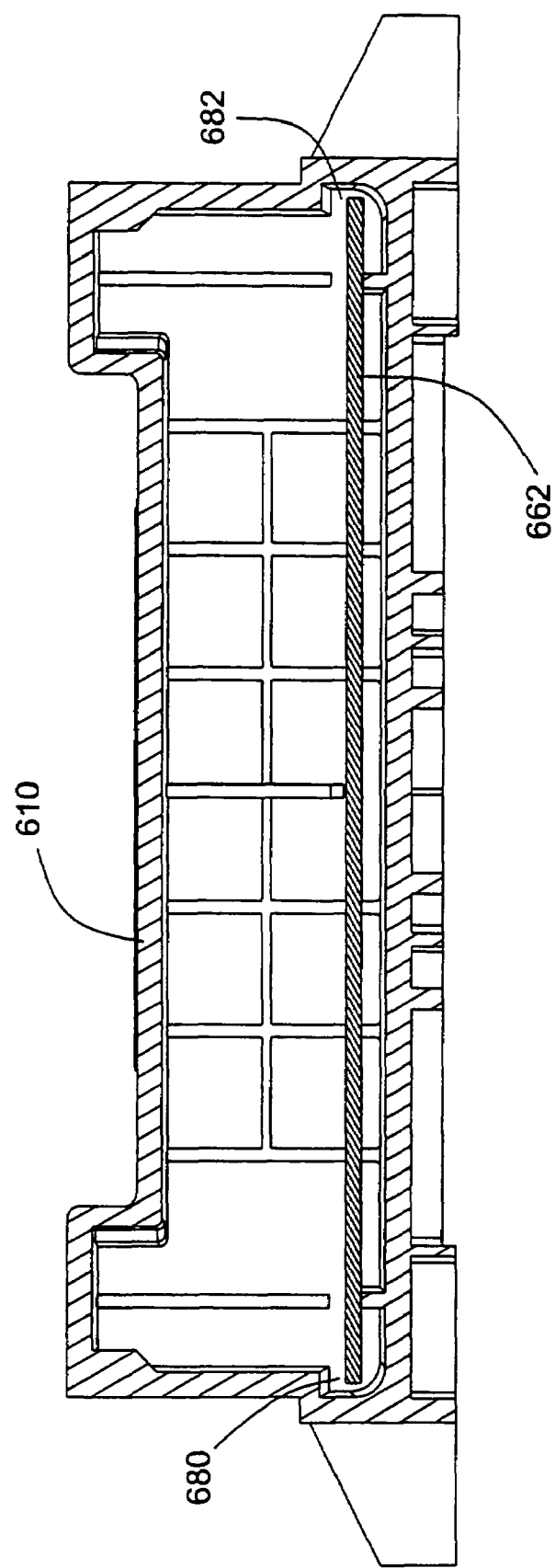
FIG. 30 is a cross-sectional view of the embodiment shown in FIG. 29.

In another embodiment, the heat sinks may be removed from the enclosure housing if the heat sinks are not needed. The openings in the housing where the heat sinks would extend through the housing would be covered with housing material. For example, FIGS. 29 and 30 show one embodiment with the heat sinks removed from the embodiment shown in FIGS. 8 and 9. If desired, the heat sinks may be removed from the other embodiments as appropriate.

In addition, the enclosure housing may include a channel to engage the substrate. Referring to FIGS. 29 and 30, the housing 610 may include channels 680, 682 which will engage the substrate 662. The channels 680, 682 may assist in preventing the substrate 662 from moving vertically if the housing is subjected to movement.

Figure 11:
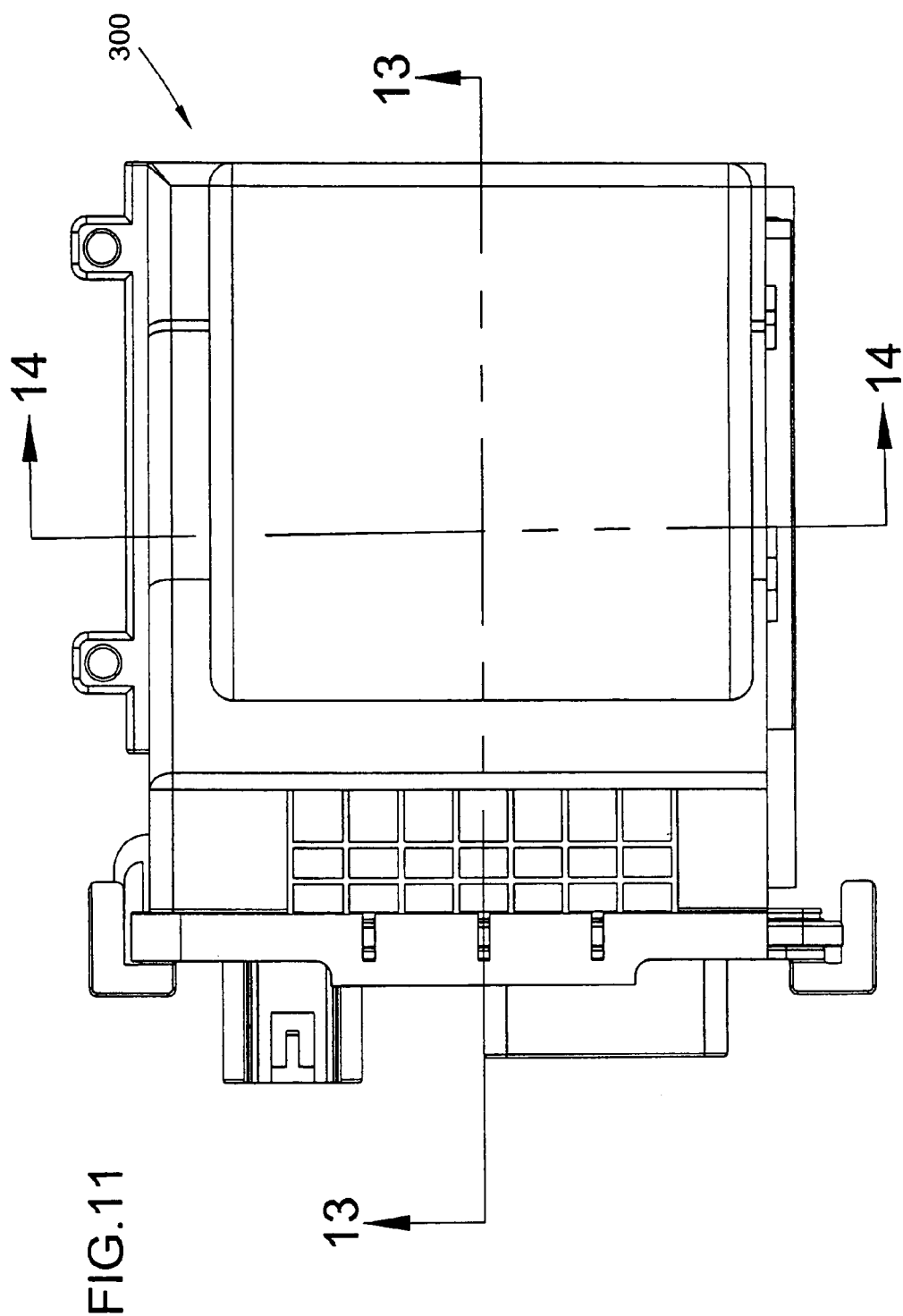
FIG. 11 is a top plan view of another embodiment of an electronic control enclosure for protectively housing the electronic components of an electronic control unit.
Figure 12:
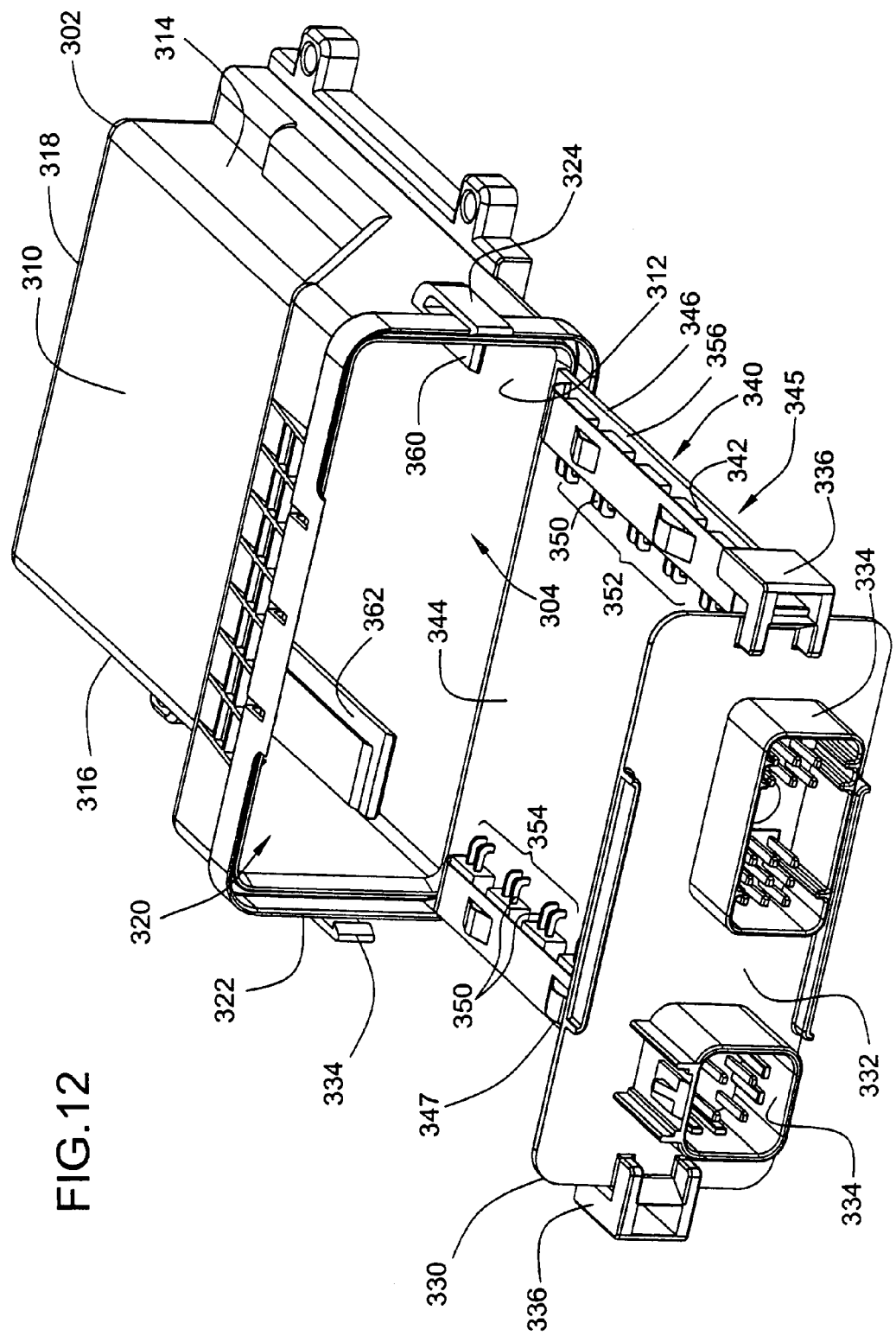
FIG. 12 is a top perspective view of the electronic control enclosure of FIG. 11, illustrating a header assembly and a substrate assembly being inserted into an enclosure housing.
Figure 13:
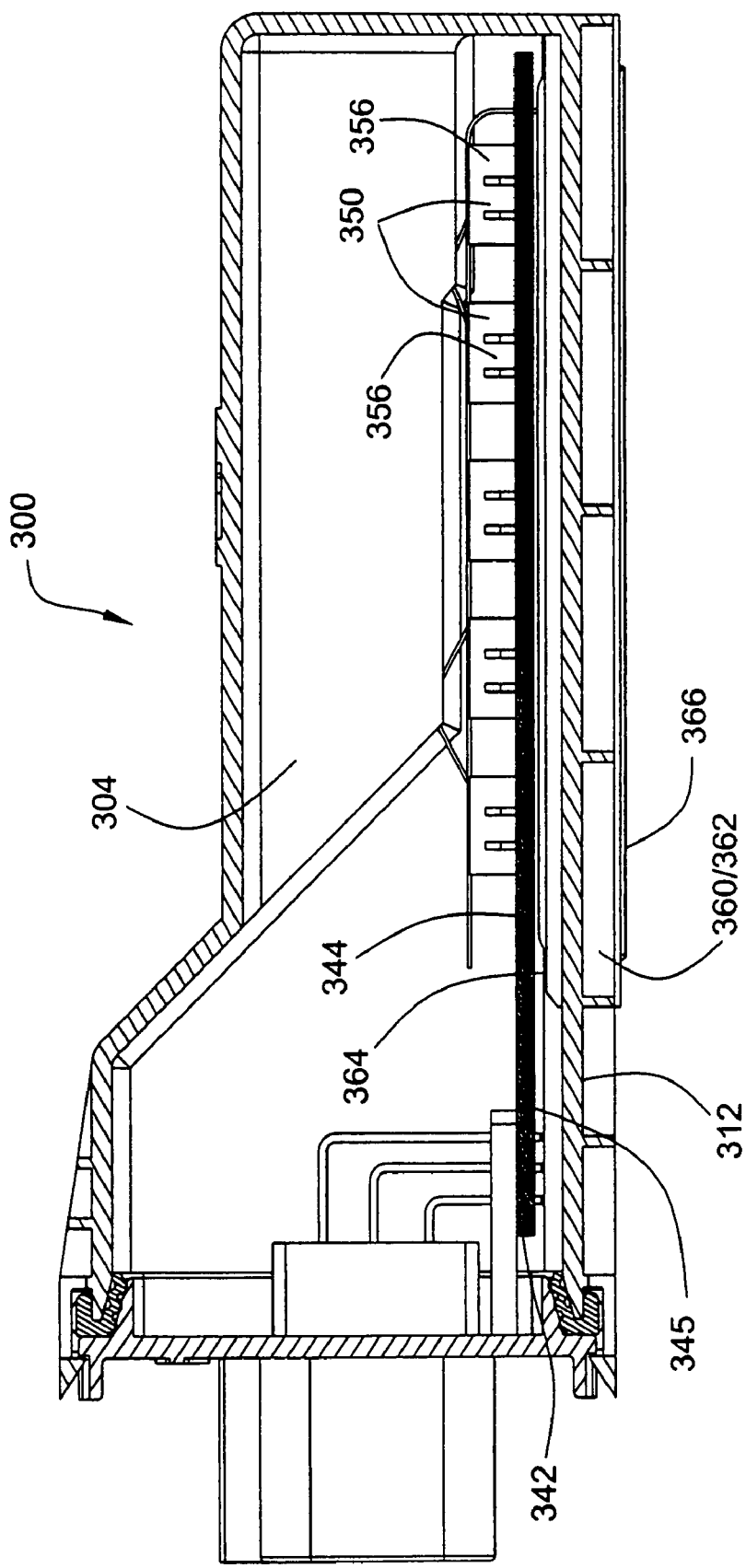
FIG. 13 is a cross-sectional view taken along line 13-13 of FIG. 11 illustrating the header assembly and substrate assembly inserted into the enclosure housing.

Illustrated in FIGS. 11 through 16 is another embodiment of the electronic control enclosure 300 for housing the components of an electronic control unit. As illustrated in FIG. 11, the electronic control enclosure 300 is generally rectangular with a low profile so that the electronic control enclosure will not interfere with other devices situated in the same environment. Referring to FIG. 12, the electronic control enclosure 300 includes an enclosure housing 302 that defines an interior chamber 304 into which the electronic components can be inserted. The enclosure housing 302 includes a top wall 310, an opposing bottom wall 312, and first and second sidewalls 314,316 extending between the top and bottom walls. A rear wall 318 extends across and is joined to the rear edges of the top, bottom, and sidewalls to enclose the enclosure housing 302. The enclosure housing can be made from injection molded plastic. In other embodiments, the enclosure housing may be made from a heat conductive material, such as metal.

To access the interior chamber 304, the forward portion of the enclosure housing 302 opposite the rear wall 318 is formed as an opening 320. The opening 320 is defined by a rim 322 made up of the forward-most edges of the top, bottom, and sidewalls 310, 312, 314, 316. To establish electronic communication with the electronic components inside the enclosure housing 302 while simultaneously enclosing the interior chamber 304, there is included as part of the electronic control enclosure 300 a header assembly 330. The header assembly 330 includes a front plate 332 that can be received within the opening 320 so as to environmentally seal the interior chamber 304. Extending forward from the front plate 332 are one or more receptacle walls 334 in which plugs can be received. To attach the header assembly 330 to the enclosure housing 302, latch arms 324 and latch catches 336 are provided that function as described above.

To mount and interconnect the various electronic components of the electronic control unit, the electronic control enclosure 300 includes a substrate assembly 340. The substrate assembly 340 includes a generally planar substrate 342 having a first surface 344 and an opposing second surface 345 to which electronic components, such as MOSFET devices 350, can be mounted. In the illustrated embodiment, the MOSFET devices 350 are arranged into two rows 352, 354, each extending from the front plate 332 rearward along the first and second side-edges 346, 347 of the substrate 342. The MOSFET devices 350 are laid horizontally flat with their heat transfer surfaces 356 adjacent to the substrate 342. Furthermore, the substrate 342 is rigidly attached to and extends rearward from the front plate 332 of the header assembly 330.

Figure 14:
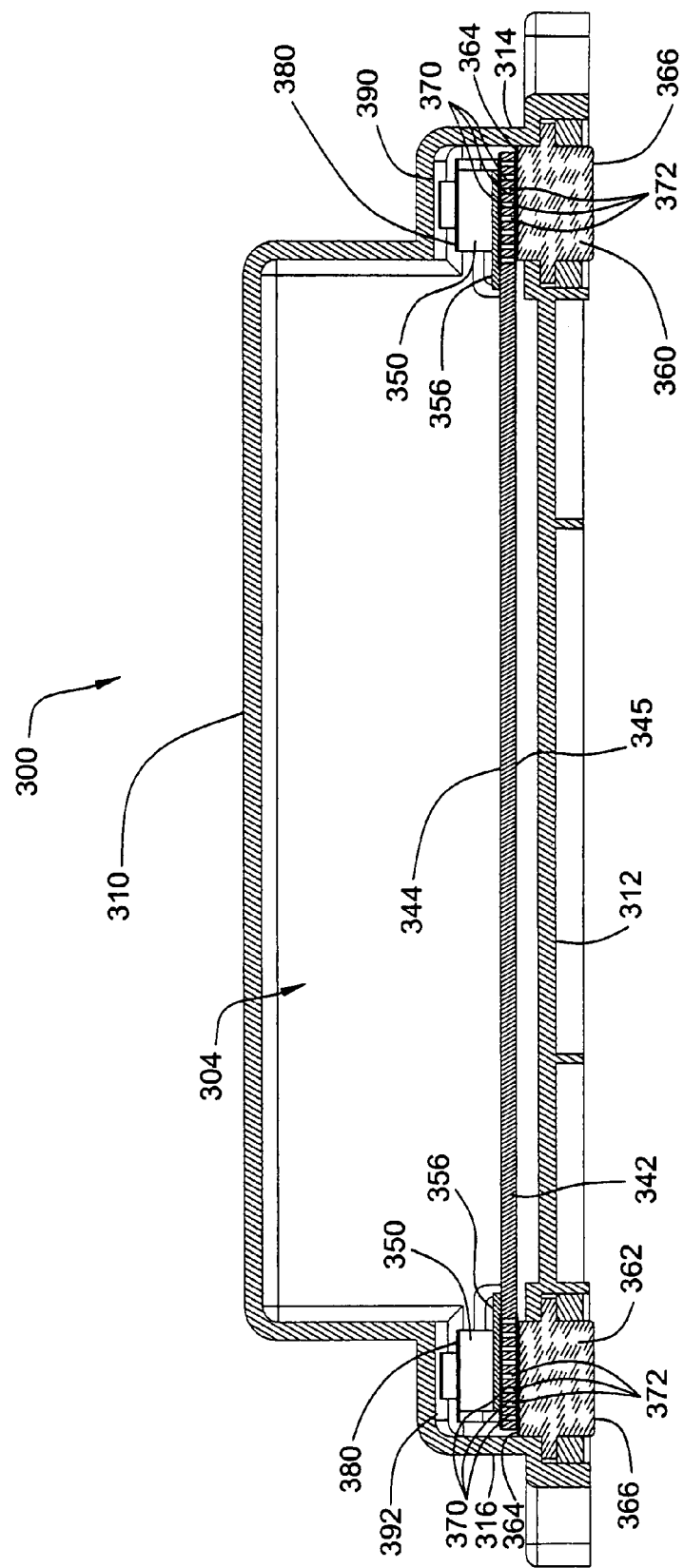
FIG. 14 is a cross-sectional view taken along line 14-14 of FIG. 11 with the header assembly and substrate assembly inserted into the enclosure housing.

To remove heat generated from the MOSFET devices 350, referring to FIG. 12, the electronic control enclosure 300 includes a first heat sink 360 and a second heat sink 362. The first and second heat sinks 360, 362 may be disposed through the bottom wall 312 so as to generally extend along the respective first and second sidewalls 314, 316. In the embodiment illustrated in FIGS. 13, 14, 15, and 16, the first and second heat sinks 360, 362 each have an interior surface 364 and an exterior surface 366. The interior surface 364 is generally parallel to and slightly offset above the bottom wall 312 while the exterior surface 366 is parallel to and offset below the bottom wall. Referring to FIG. 14, when the substrate assembly is inserted into the interior chamber 304, the substrate 342 extends between the first and second sidewalls 314, 316 and overlies the interior surface 364 of the heat sinks 360, 362. In other embodiments, the enclosure housing may be made of a heat conductive material, such as metal, and the heat sink is integral with the enclosure housing.

Referring to FIG. 14, to transfer the heat energy generated by the MOSFET devices 350 to the heat sinks 360, 362, the substrate 342 includes multiple apertures 370 disposed between the first and second surfaces 344, 345 that align with the heat transfer surfaces 356 of the MOSFET devices. Located in each aperture 370, so as to contact both the heat transfer surfaces 356 and the interior surface 364, is a heat conductive element 372, such as a solder, or other low melting heat transferable materials. Accordingly, the heat conductive elements 372 transfer the heat across the substrate 342.

Figure 15:
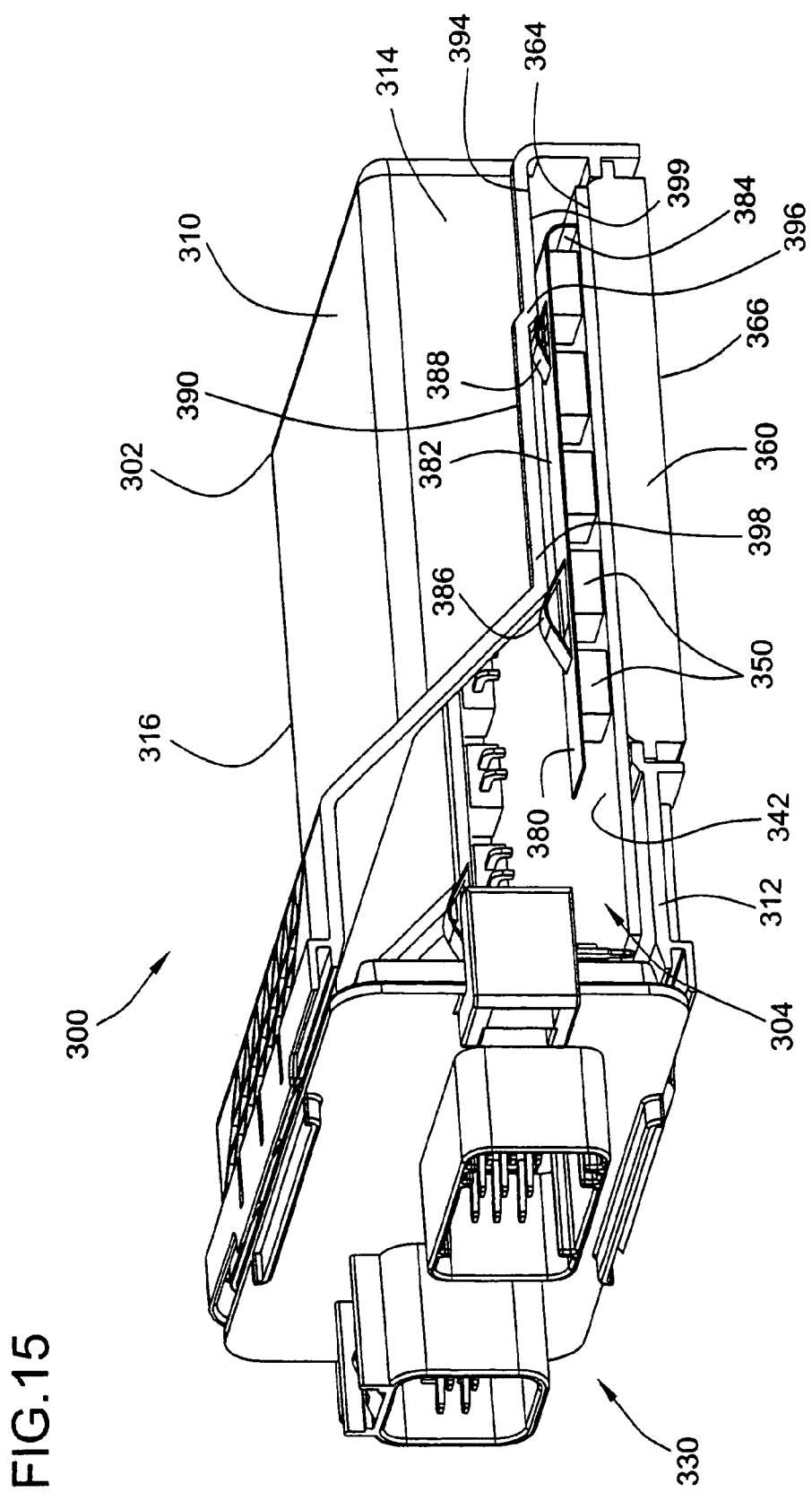
FIG. 15 is a first side perspective view of the electronic control enclosure with the side removed to illustrate the header assembly and substrate assembly as substantially inserted to a pre-load position.
Figure 16:
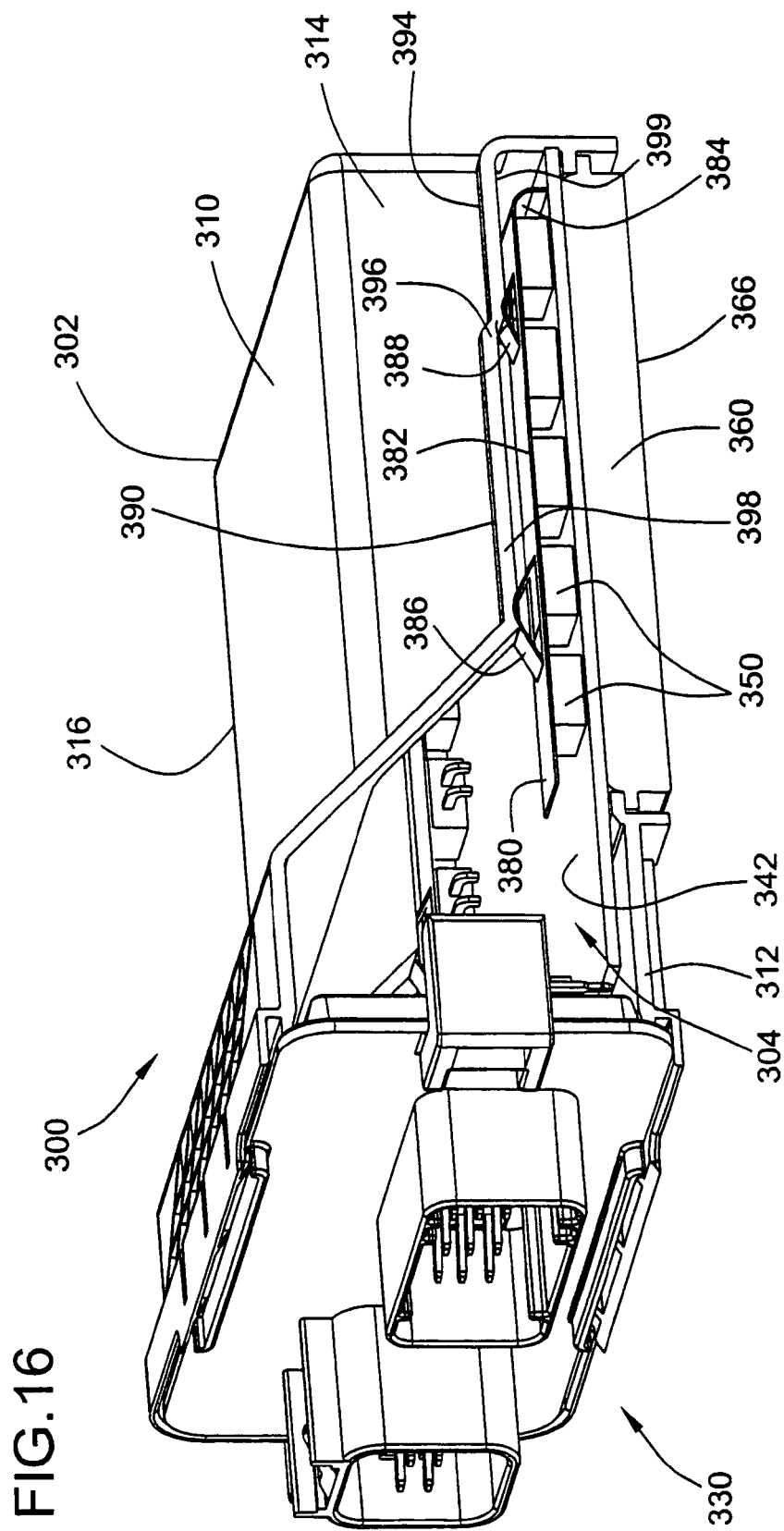
FIG. 16 is a first side perspective view of the electronic control enclosure with the side removed to illustrate the header assembly and substrate assembly as fully inserted to a loaded position.
Figure 17:
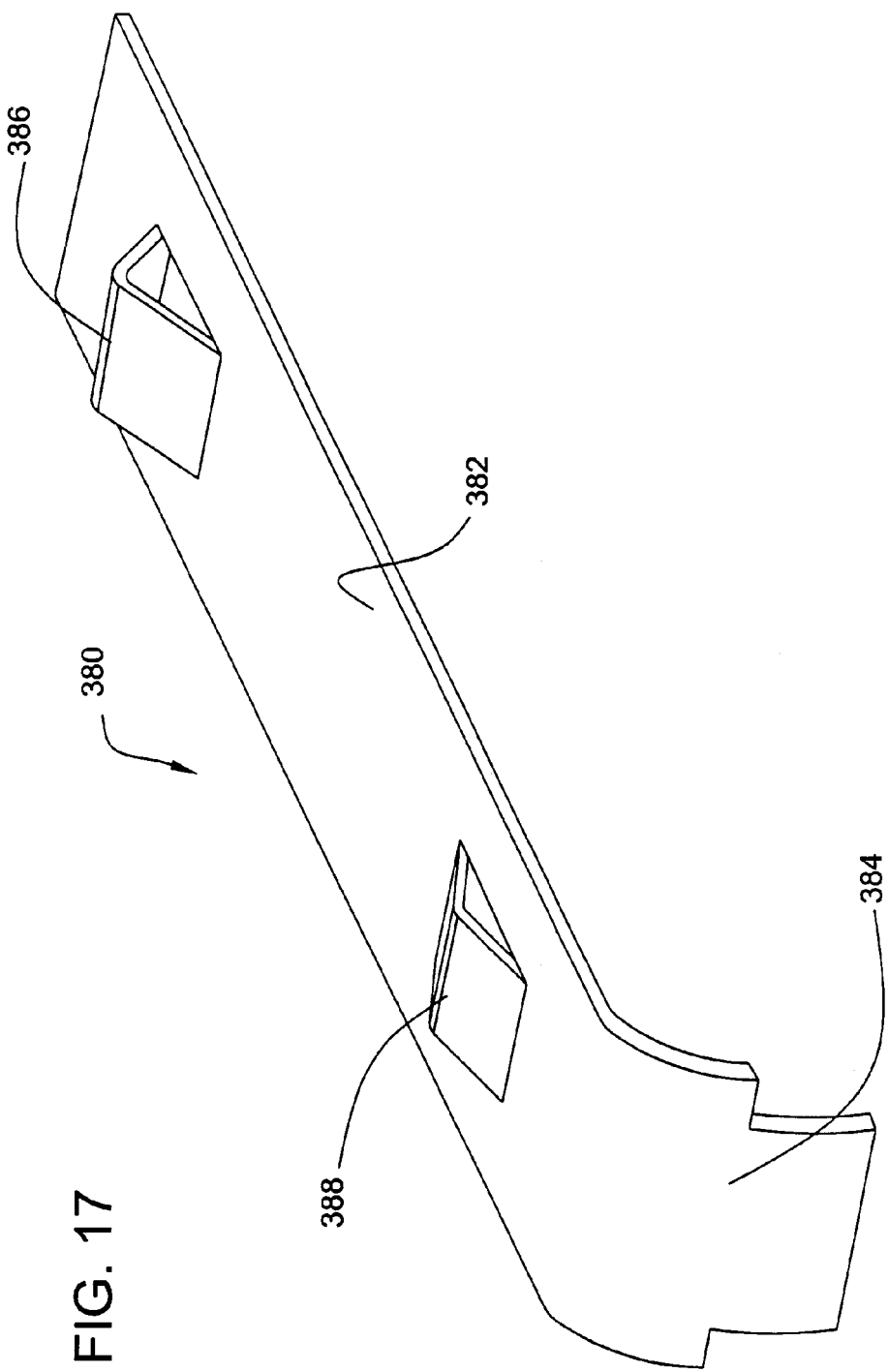
FIG. 17 is a perspective view of a spring plate for urging electronic components toward heat sinks in the electronic control enclosure of FIG. 11.

To ensure adequate thermal contact between the MOSFET devices 350 and the heat conducting elements 372, as illustrated in FIGS. 14, 15, and 16, the electronic control enclosure includes spring plates 380 and embossments 390, 392 that are capable of engaging each other. Referring to FIG. 17, the spring plate 380 includes an elongated compression leg 382 that terminates at one end in an attachment foot 384. The attachment foot 384 curves approximately ninety degrees with respect to the orientation of the compression leg 382. Protruding from the compression leg 382 are first and second compression features 386, 388, the first compression feature protruding a greater distance from the plane of the compression leg than the second compression feature. Additionally, the first compression feature 386 is located further away from the attachment foot 384 than the second compression feature 388. The spring plate 380 can be made from any suitable material, such as, for example, sheet metal that has been stamped and formed.

Referring to FIGS. 15 and 16, the spring plates 380 are mounted to the substrate 342 so that the compression leg 382 extends over the MOSFET devices 350 and the attachment leg 384 is attached to the substrate generally towards the rear of the interior chamber 304. To engage the spring plates 380, referring to FIG. 14, the first and second embossments 390, 392 extend along the respective first and second sidewalls 314, 316 projecting from the top wall 310 toward the bottom wall 312. As illustrated in FIGS. 15 and 16, the embossments 390, 392 each include a lower edge 394 that is generally parallel to and spaced-apart from the bottom wall 312 and the substrate 342. The lower edge 394 furthermore is divided by a step 396 into a first lower edge portion 398 and a second lower edge portion 399, wherein the first lower edge portion is spaced further apart from the bottom surface 312 than the second lower edge portion.

As will be appreciated from FIGS. 15 and 16, when the substrate assembly 330 is inserted into the interior chamber 304, the substrate 342, the MOSFET devices 350, and the spring plate 380 are received in the space between the lower edge 394 and the bottom wall 312. To avoid damaging the MOSFET devices 350 during insertion, the spring plate 380 and embossments 390, 392 are configured to only engage each other once the substrate 342 has been fully inserted into a loaded position. Referring to FIG. 15, as the substrate assembly 330 is initially inserted, the smaller second compression feature 388 is loosely received in the gap between the first lower edge portion 398 and the bottom surface 312. This position is the pre-load position, which exists over a substantial range of insertion of the substrate assembly, wherein the embossments and spring plates do not significantly urge the MOSFET devices toward the heat sinks. Accordingly, as mentioned above, the electronic enclosure demonstrates a zero insertion force effect during insertion of the substrate assembly to the preload position.

Referring to FIG. 16, as the second compression feature 388 passes under the step 396 and engages the second lower edge portion 399, the spring plate 380 is directed towards the bottom surface 312 and down upon the MOSFET devices 350. Additionally, once the substrate assembly 330 is fully inserted, the larger first compression feature 386 engages the first lower edge portion 398 likewise causing the spring plate 380 to urge the MOSFET devices 350 toward the heat sink 360. This position is the loaded position, which exists after fully inserting the substrate assembly, wherein the embossments and spring plates do significantly urge the MOSFET devices toward the heat sinks. Referring to FIG. 14, urging the MOSFET devices 350 toward the heat sinks 360, 362 places the heat conductive elements 372 located in the apertures 370 under compression between the heat transfer surfaces 356 and the interior surfaces 364, thereby transferring the generated heat energy from the interior chamber. In some embodiments, to assist in transferring heat energy away, a thermal conducting paste, adhesive, or pad may be placed between the heat transfer surfaces and the interior surfaces.

Figure 18:
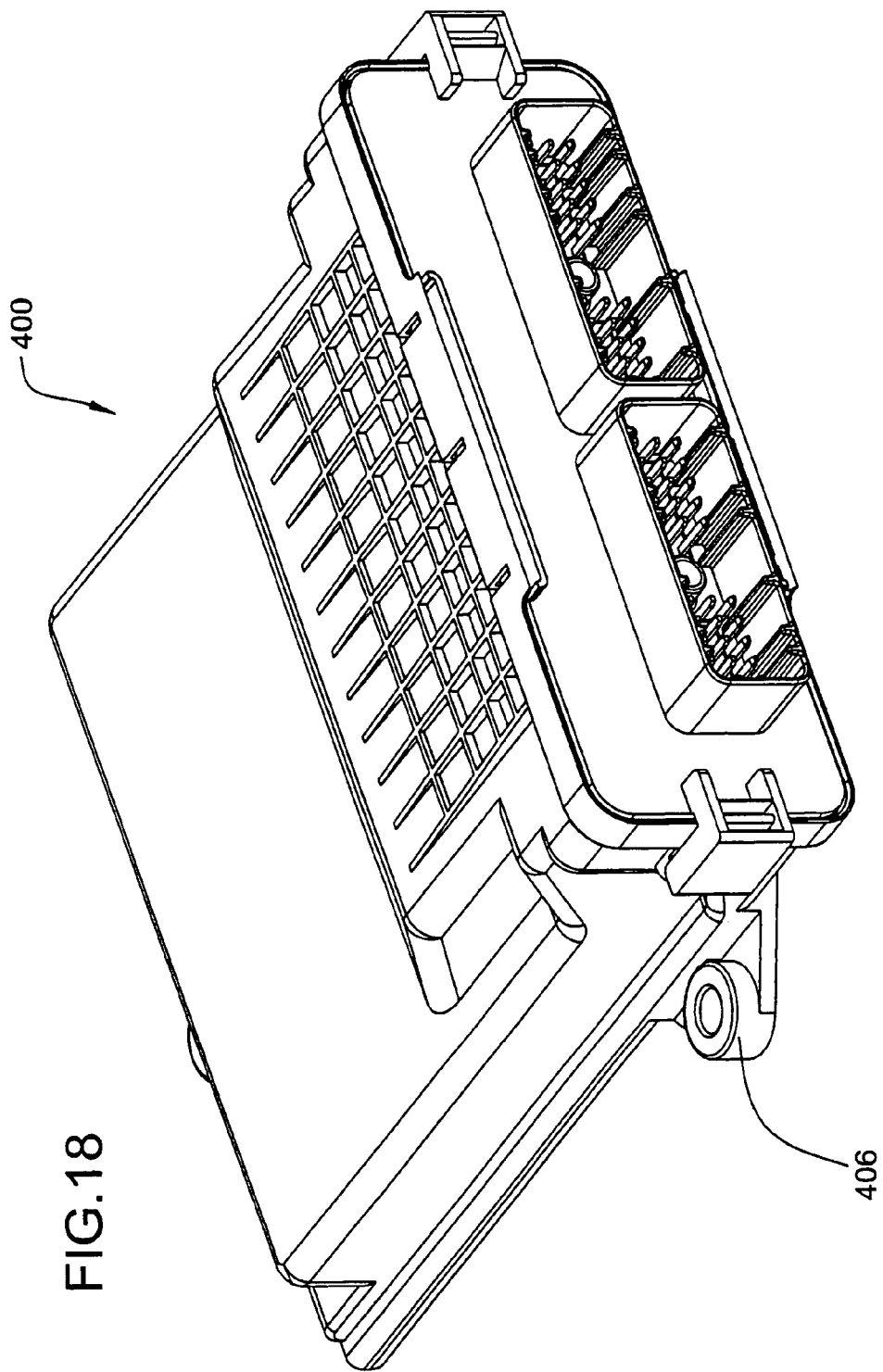
FIG. 18 is a front perspective view of another embodiment of an electronic control enclosure for protectively housing the electronic components of an electronic control unit.
Figure 19:
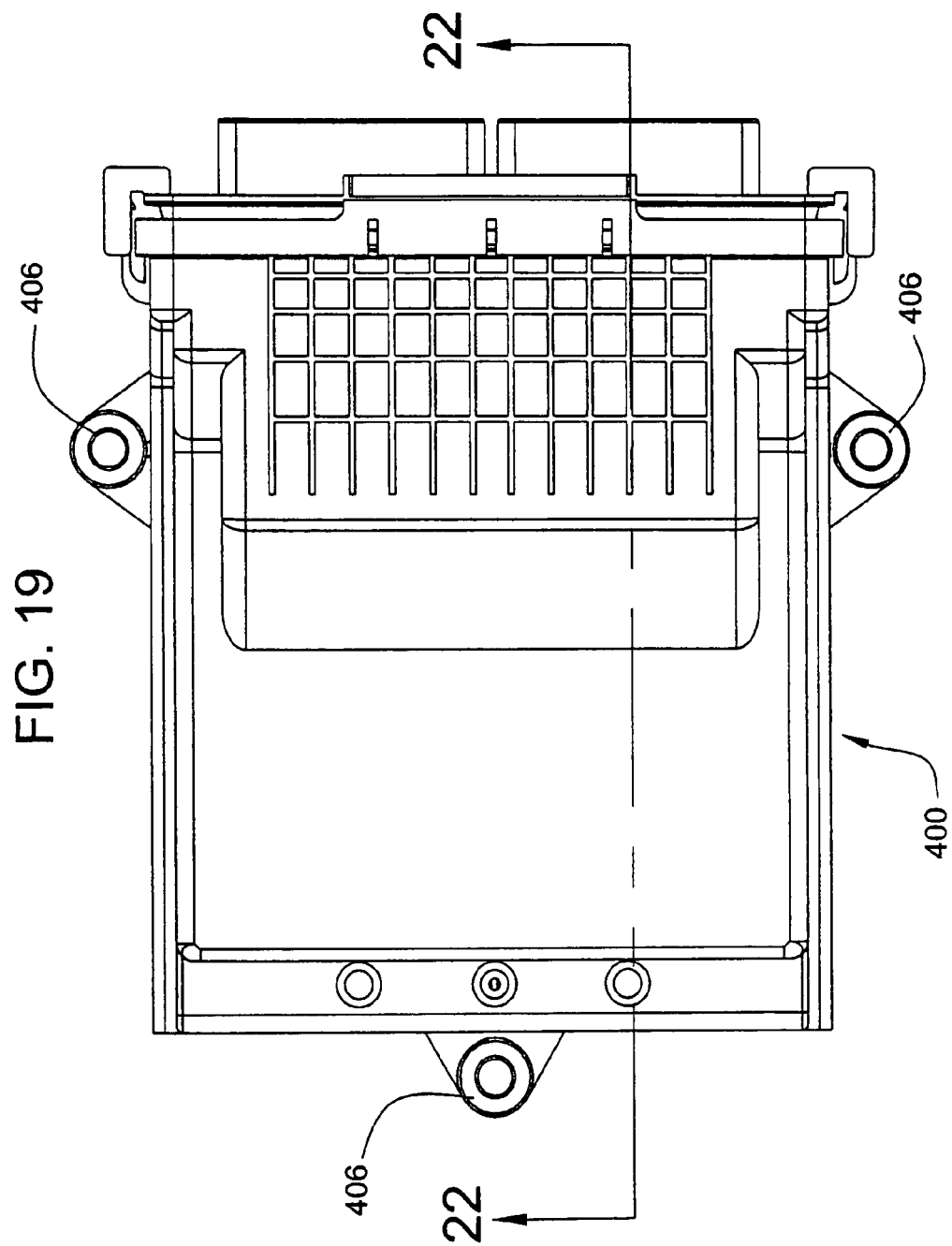
FIG. 19 is a top plan view of the electronic control enclosure of FIG. 18.

Referring to FIGS. 18 and 19, there is illustrated another embodiment of an electronic control enclosure 400 for housing the components of an electronic control unit. The electronic control enclosure 400 has a generally rectangular shape and a low profile so as to not interfere with other external devices situated in the same environment. To mount the electronic control enclosure 400 to a panel, mounting feet 406 project from the sides of the electronic control enclosure through which fasteners can be inserted.

Figure 20:
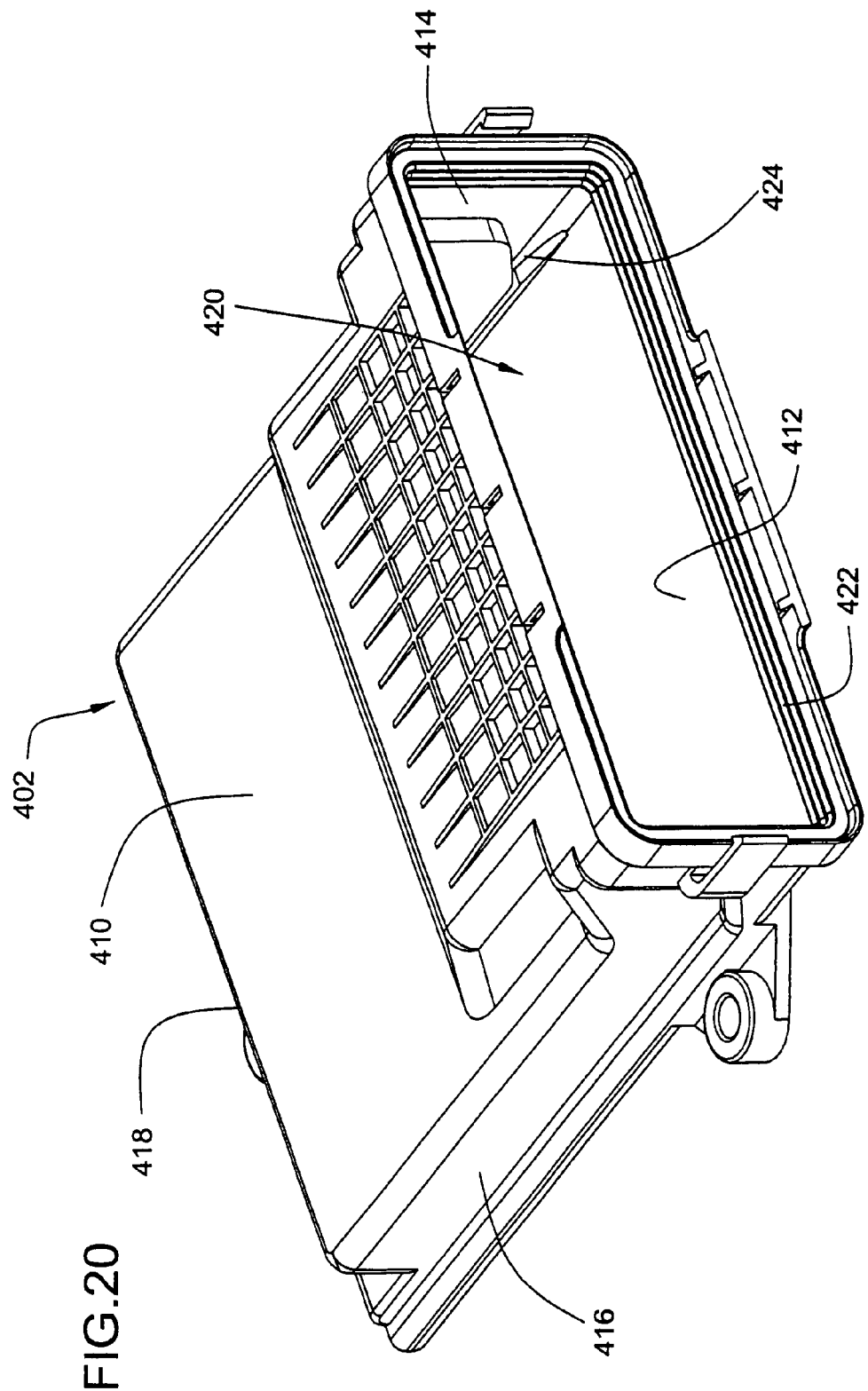
FIG. 20 is a top perspective view of an enclosure housing defining an interior chamber for receiving the electronic components of the electronic control enclosure of FIG. 18.
Figure 21:
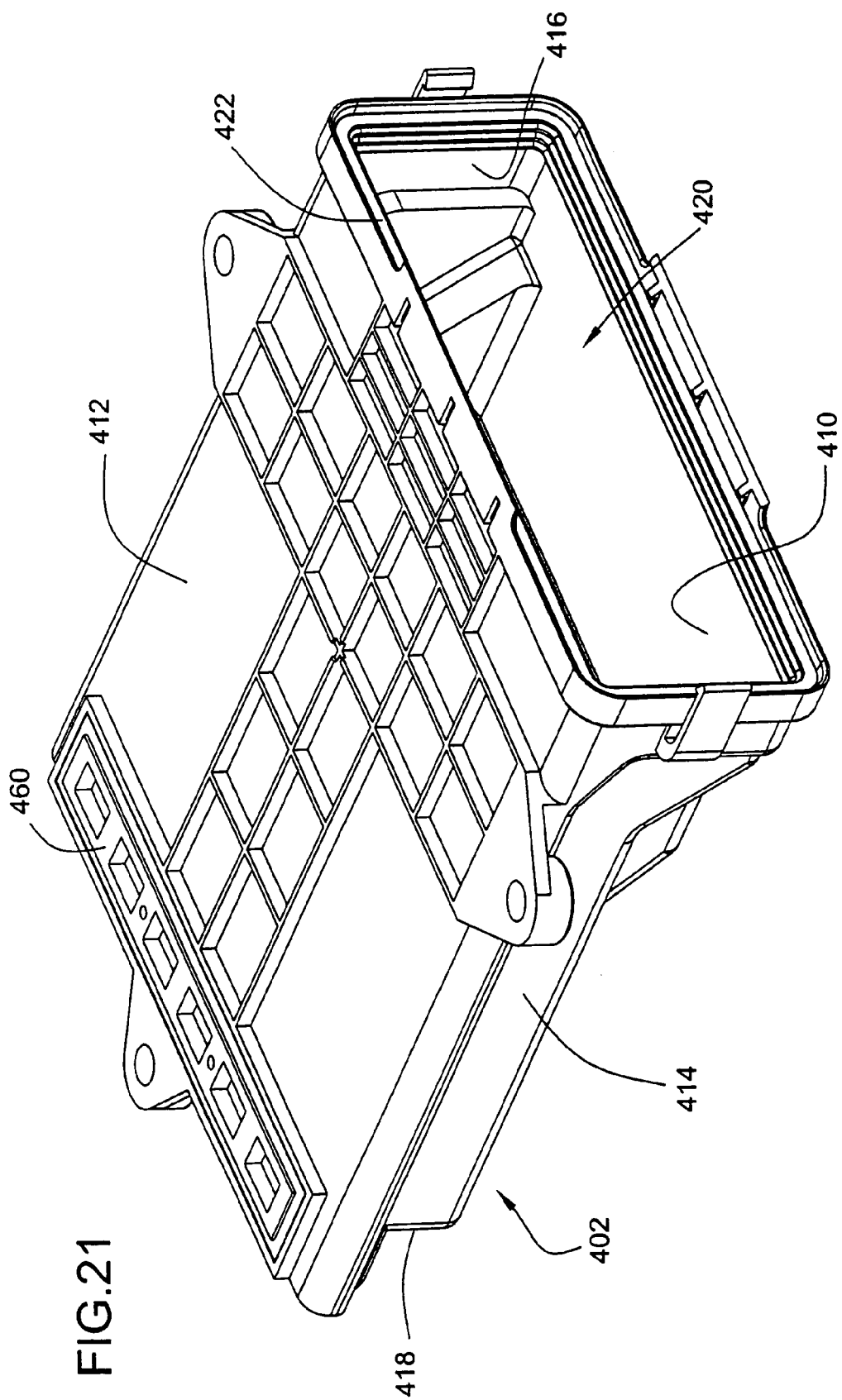
FIG. 21 is a bottom perspective view of the enclosure housing illustrated in FIG. 20.

To protectively house the electronic components of the electronic control unit, referring to FIGS. 20 and 21, there is included an enclosure housing 402 that defines an interior chamber 404. The enclosure housing 402 has a top wall 410, an opposing bottom wall 412, and first and second sidewalls 414, 416 extending between the top and bottom walls. Extending across the rear of the enclosure housing 402 and joined to the rear edges of the top, bottom, and sidewalls 410, 412, 414, 416 is a rear wall 418. To access the interior chamber 404, the front part of the enclosure housing 402 opposite the rear wall 418 is formed as an opening 420 defined by a rim 422 composed of the forward edges of the top, bottom, and sidewalls 410, 412, 414, 416. Formed on the interior side of each sidewall 414, 416 proximate and extending parallel to the bottom wall 412 is a groove 424. The enclosure housing 402 can be made of injection molded plastic or other suitable material such as metal.

Figure 22:
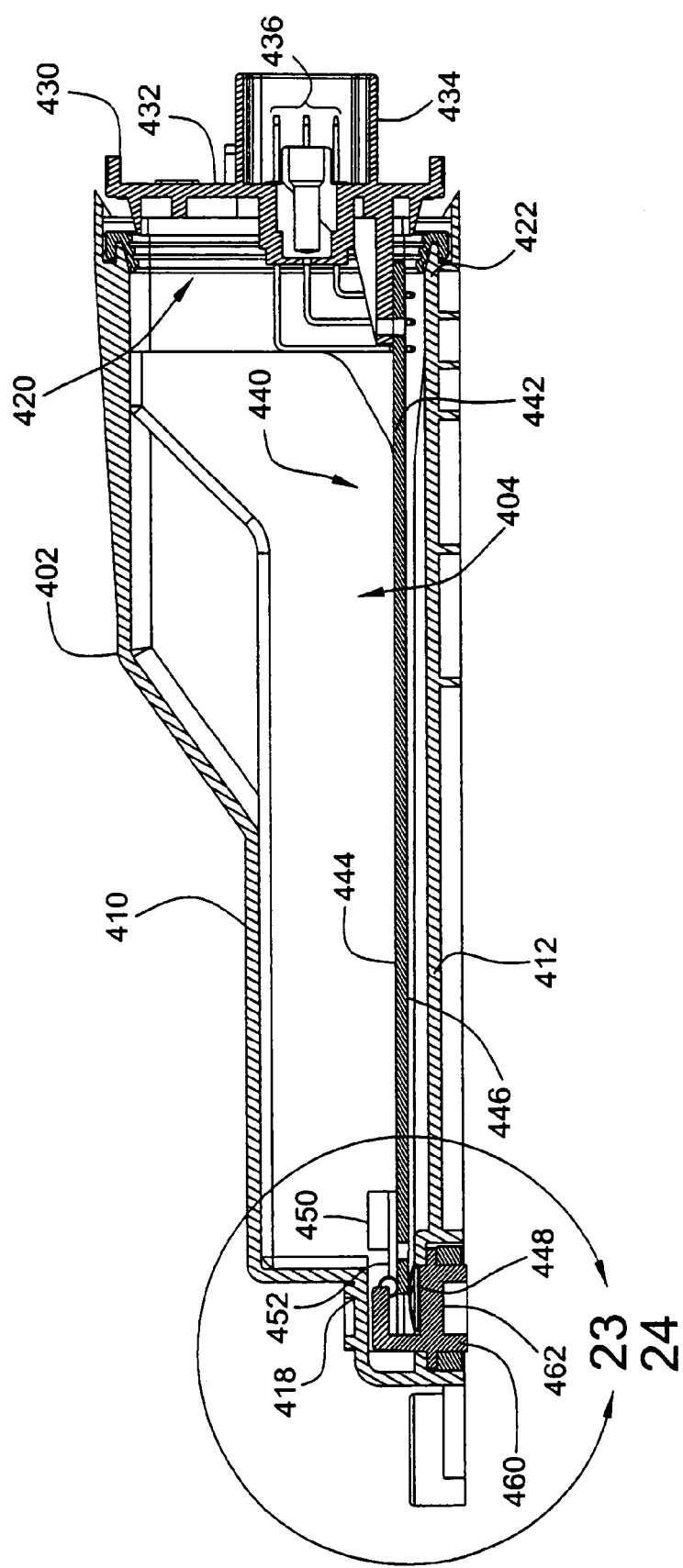
FIG. 22 is a cross-sectional view taken along line 22-22 of FIG. 19 illustrating a header assembly and a substrate assembly inserted into the enclosure housing.

To enclose the interior chamber and to provide electrical communication with the electronic components included therein, referring to FIG. 22, the electronic control enclosure 400 includes a header assembly 430 that can be received within the opening 420 and constrained by the rim 422. The header assembly 430 includes a front plate 432 from which one or more receptacle walls 434 extend. The receptacle walls 434 protectively surround a plurality of terminals 436 that extend through the front plate 432 and are configured to receive plugs from external electrical devices. A substrate assembly 440 is attached to and extends from a lower portion of the front plate 432. The substrate assembly 440 includes a generally planar substrate 442 having a first surface 444, an opposing second surface 446, and conductive electrical traces formed thereon. The substrate 442, when inserted into the interior chamber 404, extends rearward and generally parallel to the bottom wall 412 with the first surface 444 oriented toward the top wall 410. To align the substrate 442 within the interior chamber 404, referring to FIG. 20, it will be appreciated that the edges of the substrate can be received in the grooves 424 formed into the sidewalls.

Referring to FIG. 22, there is mounted to the substrate 442 proximate to and aligned with the substrate's rear-most edge 448 a plurality of electronic components such as MOSFET devices 450. The exposed heat transfer surfaces 452 of the MOSFET devices 450 are mounted adjacent to the first surface 444 of the substrate and directed toward the rear wall 418. To remove the heat energy generated from the MOSFET devices, the electronic control enclosure 402 includes a heat sink 460 that maybe disposed through the bottom wall 412 to contact the heat transfer surfaces 452. The heat sink 460 thereby transfers heat energy from the devices to an exterior surface 462 of the heat sink that is exposed along the exterior of the enclosure housing 402. In other embodiments, the enclosure housing may be made of a heat conductive material, such as metal, and the heat sink is integral with the enclosure housing.

To facilitate the transfer of heat energy between the MOSFET devices and the heat sink, the exposed heat transfer surfaces of the MOSFET devices are urged against the heat sink by a spring force. Specifically, as illustrated in FIGS. 23 and 24, a portion of the heat sink 460 is disposed within the interior chamber 404 by an upright transition arm 464 that extends through the bottom wall 412. Connected to and extending forward from the transition arm 464 is a contact arm 466, which extends parallel to and is spaced-apart from the bottom wall 412. Preferably, the transition arm 464 and contact arm 466 extend along the length of the rear edge 448 of the substrate 442. Located at the free end of the contact arm 466 is a circular-shaped locator 468 that protrudes down toward the bottom wall 412. The heat sink 460 may include multiple locators 468 spaced-apart from each other along the length of the contact arm 466. Also included is a leaf spring 474 proximate to the bottom wall 412 and which cambers upwards toward and generally aligned with the contact arm 466.

Referring to FIG. 24, when the substrate 442 is fully inserted into the interior chamber 404, the rear edge 448 of the substrate is located between the contact arm 466 and the bottom surface 412 with the heat transfer surfaces 452 of the MOSFET devices 450 underneath the contact arms. Moreover, the leaf spring 474 biases the substrate 442 upwards thereby urging the heat transfer surface 452 against the contact arm 466. To assist in transferring heat energy, in some embodiments, a thermal conducting paste, adhesive, or pad may be placed between the heat transfer surfaces and the interior surfaces.

Referring to FIG. 23, to facilitate inserting the substrate 442 underneath the contact arm 466 without damaging the heat transfer surfaces 452, it will be appreciated that as the locator 468 comes into contact with the rear edge 448 and the locator 468 deflects the substrate 442 down toward the bottom surface 412. This deflection presses the substrate 442 against the leaf spring 474 while providing a gap between the contact arm 466 and the heat transfer surface 452 enabling movement between the two. The gap is indicated by arrows 476 in FIG. 23. This position is the preload position, wherein the leaf spring can not urge the MOSFET device against the heat sink. To eliminate the gap, the substrate 442 includes one or more recesses 459 disposed into the offset surface offset slightly forward of the rear edge 448. Once the substrate 442 is fully inserted, as illustrated in FIG. 23, the recess 459 aligns with and receives the locator 468 allowing the leaf spring 474 to project the substrate upwards. Accordingly, contact is made and adequate thermal transfer occurs between the heat transfer surfaces 452 and the contact arm 466. This position is the loaded position, wherein the leaf spring urges the MOSFET device against the heat sinks.

Figure 25:
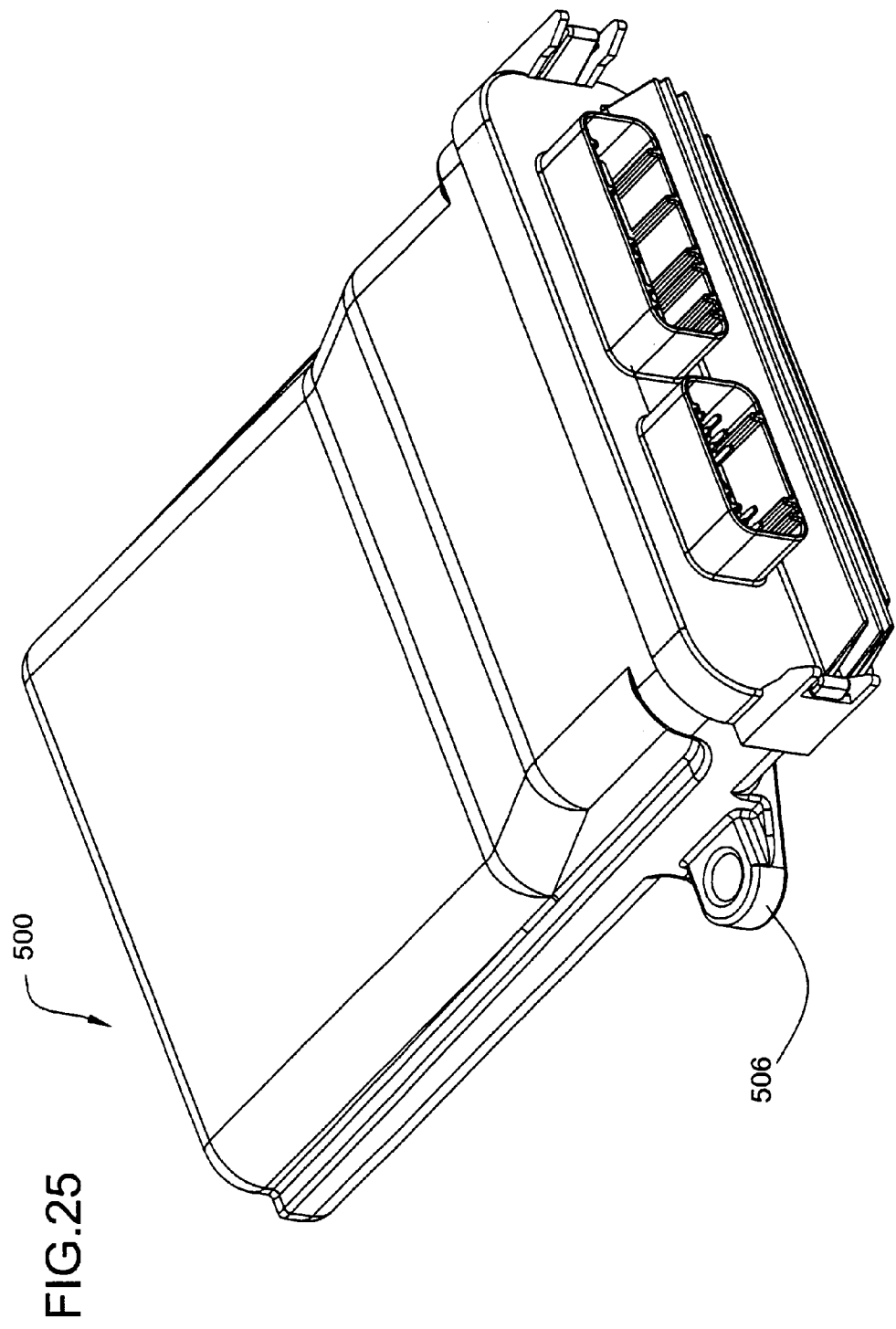
FIG. 25 is a top perspective view of another embodiment of an electronic control enclosure for protectively housing the electronic components of an electronic control unit.

Illustrated in FIG. 25 is another embodiment of an electronic control enclosure 500 for housing the components of an electronic control unit. The electronic control enclosure 500 has a generally rectangular shape with a low profile so as to not interfere with other devices that may be situated within the same environment. To mount the electronic control enclosure 500 to a panel, one or more mounting feet 506 project from the sides that can receive fasteners. The electronic control enclosure 500 defines an interior chamber in which the electronic components that make up the electronic control unit can be protectively housed.

Figure 26:
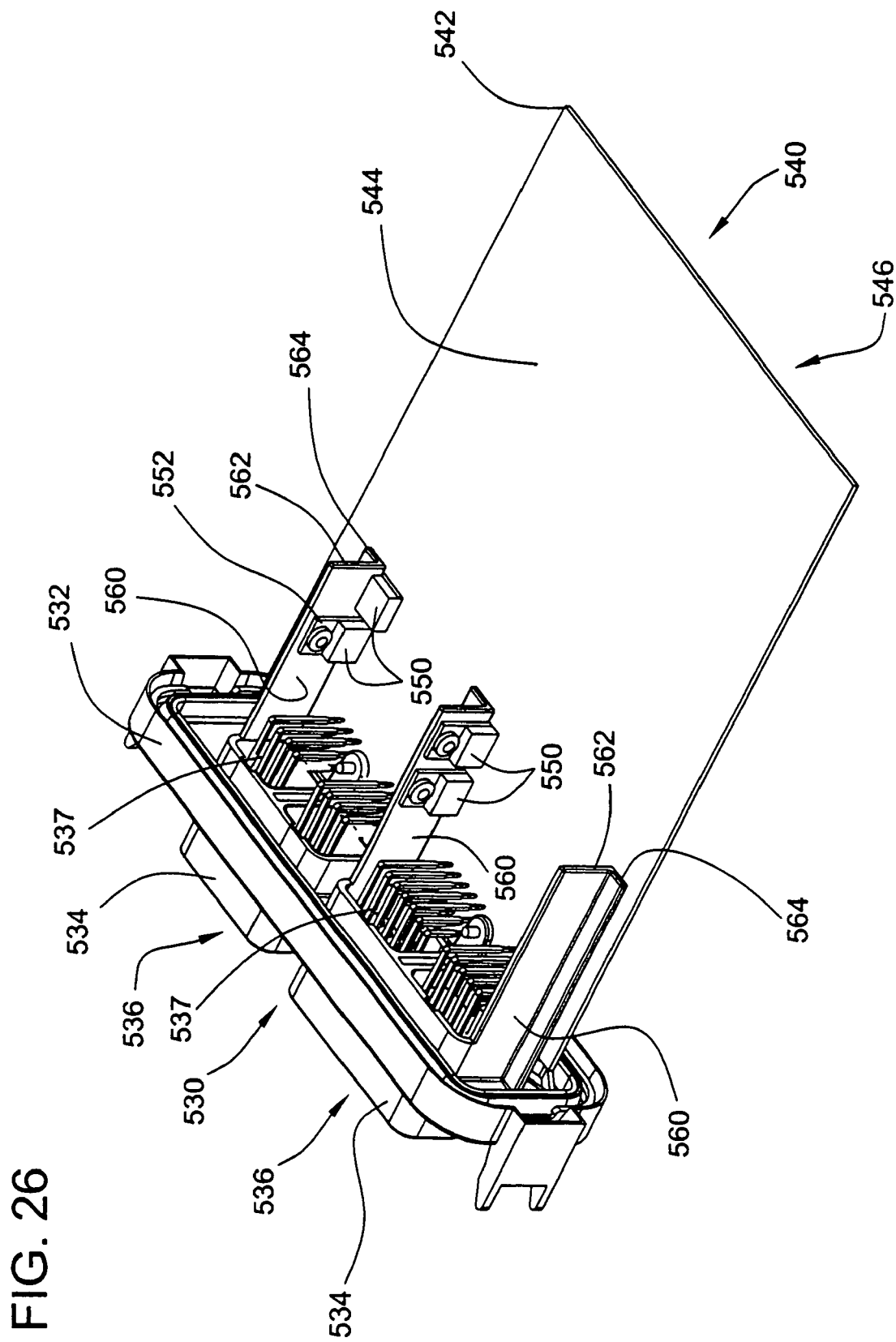
FIG. 26 is a rear perspective view of a header assembly and a substrate assembly for the electronic control enclosure of FIG. 25.

Referring to FIG. 26, to mount and interconnect the various electronic components of the electronic control unit together in a manner facilitating their insertion into the interior chamber, there is included a header assembly 530 to which there is attached a rearward-extending substrate assembly 540. The header assembly 530 includes a planar front plate 532 from which projects one or more forward-extending receptacle walls 534 that surround a plurality of terminals 536. The terminals 536 each include a terminal lead 537 projecting rearward from the front plate 532 which are formed with right angles directing the terminal leads downward to contact the substrate assembly 540. The front plate 532 and the receptacle walls 534 are preferably made from a thermally conductive material, such as a cast aluminum, magnesium, zinc, or alloys thereof or a heat conductive plastic.

The substrate assembly 540 includes a generally planar substrate 542 having a top surface 544, an opposing bottom surface 546, and a plurality of conductive circuit traces formed thereon, such as a printed circuit board. Also included as part of the substrate assembly 540 and electrically connected to the circuit traces on the substrate 542 are the electronic components such as, for example, MOSFET devices 550 with exposed heat transfer surfaces 552.

Figure 27:
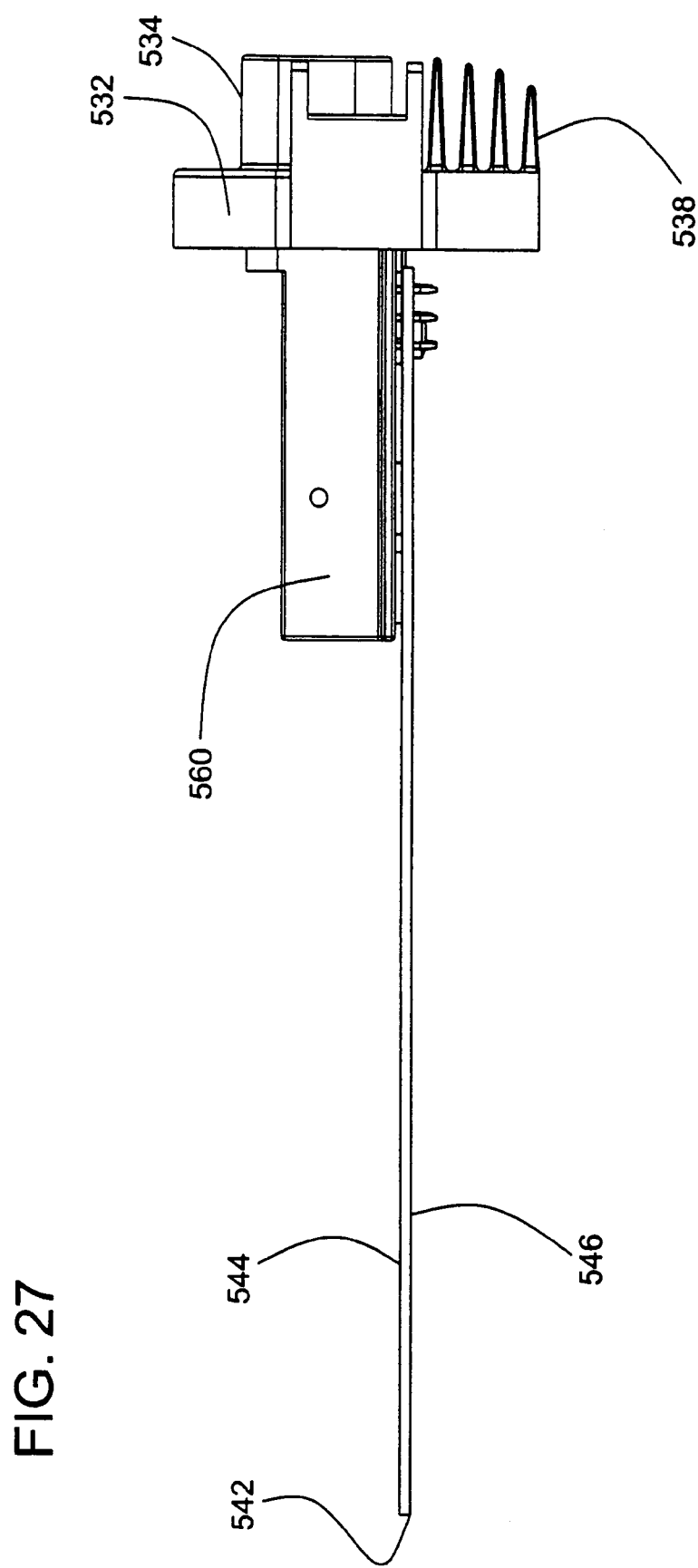
FIG. 27 is a side elevational view of the header assembly and substrate assembly of FIG. 26.
Figure 28:
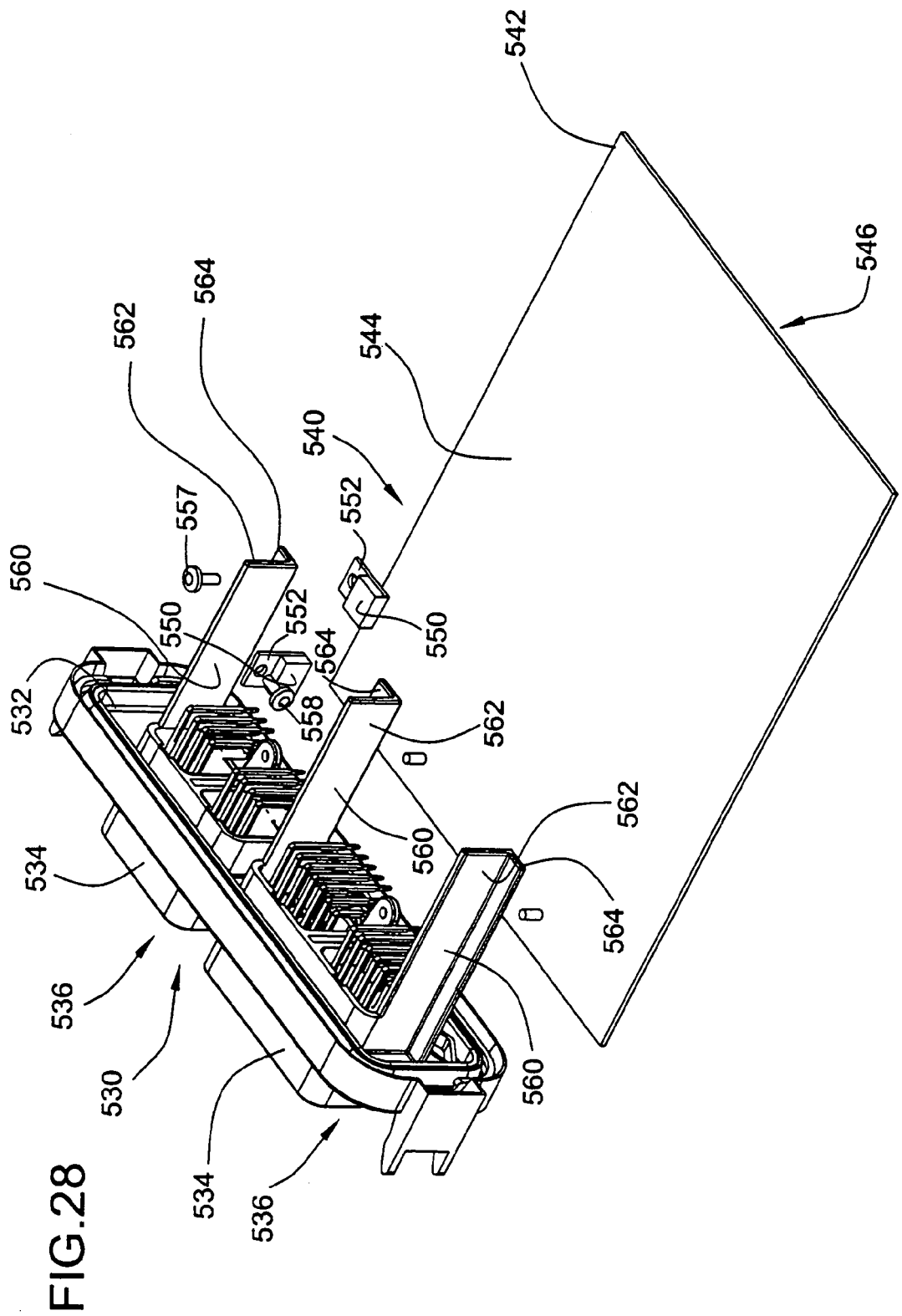
FIG. 28 is an exploded view of the header assembly and substrate assembly of FIG. 26.

To remove heat generated by the MOSFET devices, in accordance with another aspect of the present invention, the header assembly 530 also includes one or more heat sinks 560. For example, as illustrated in FIGS. 26, 27, and 28, the heat sinks 560 are shaped as elongated, parallel rails that are integrally joined to and extend rearward from the front plate 532. Moreover, in the illustrated embodiment, the heat sinks 560 have generally "L-shaped" cross-sections, including a first, longer leg 562 and a second, shorter leg 564. The heat sinks 560 are arranged so that the shorter legs 564 are adjacent to the top surface 544 of the substrate 542. Because the heat sinks 560 and front plate 532 are integrally joined and made from a thermally conductive material, the heat sinks 560 conduct heat from the interior chamber to the exposed front plate 532, which accordingly functions as the exterior surfaces described above. To dissipate the heat energy to environment, referring to FIG. 27, the front plate 532 may include one or more projecting fins 538.

To transfer heat energy from the MOSFET devices 550 to the heat sinks 560, the heat transfer surfaces 552 are placed in direct physical contact with the heat sinks. Referring to FIGS. 26 and 28, the MOSFET devices 550 are arranged with the heat transfer surfaces 552 either flat against the substrate 542 or projecting vertically upright from the substrate. For those MOSFET devices 550 arranged flatly, the heat transfer surface 552 is sandwiched between the heat sink 560 and the top surface 544, and may be secured with a fastener 557, thereby ensuring adequate thermal energy transfer. For those MOSFET devices 550 arranged vertically upright, the heat transfer surfaces 552 extend adjacently over the longer legs 562 of the heat sinks 560 and are secured thereto by a fastener 558, likewise ensuring adequate thermal energy transfer.

Accordingly, the present invention provides an electronic control enclosure for an electronic control unit. The electronic control enclosure includes an enclosure housing defining an interior chamber for electronic components of the control unit. The enclosure housing can be enclosed and environmentally sealed by a header assembly across which electrical communication can be established. To remove the heat energy generated by the electronic components in the interior chamber, the electronic control enclosure includes one or more heat sinks that have exterior surfaces exposed on the exterior of the electronic control enclosure. In various embodiments the heat sink may be disposed through the enclosure housing or the heat sink may be formed integrally with the enclosure housing. In the embodiments in which the heat sink and enclosure housing are integral and the enclosure housing is comprised of a metallic material, the entire enclosure housing can absorb and dissipate the heat energy generated from the electronic components. Additionally, to ensure good thermal contact between the electronic components and the heat sinks, the electronic control enclosure may include features that urge the electronic components and heat sinks into contact.

All references, including publications, patent applications, and patents, cited herein are hereby incorporated by reference to the same extent as if each reference was individually and specifically indicated to be incorporated by reference and was set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An electronic control enclosure comprising:
   a enclosure housing defining an interior chamber, the enclosure housing including a first wall, an opposing second wall, and a third and opposing fourth walls extending between the opposing first and second walls;
   a heat sink located at least partly in the interior chamber, the heat sink including a contact arm extending generally parallel to the second wall and a locator protruding from the contact arm;
   a spring aligned with and projecting toward the contact arm;
   a substrate assembly including a generally planar substrate having opposing first and second surfaces and a recess disposed into the first surface, the substrate assembly further including an electrical component, the electrical component having a heat transfer surface;
   wherein when the substrate is inserted into the enclosure housing such that the locator contacts the first surface, the substrate compresses the spring and is spaced apart from the contact arm; and
   when the substrate is inserted into the enclosure such that the locator is received in the recess, the spring urges the heat transfer surface against the contact arm.

2. The electronic control enclosure of claim 1, wherein the heat sink further includes an exterior surface located externally of the enclosure housing, the exterior surface joined to the contact arm by a transition arm.

3. The electronic control enclosure of claim 1, wherein the locator is generally circular in shape and curves toward the second wall.

4. The electronic control enclosure of claim 1, wherein the spring is a leaf spring cambered towards the contact arm.

5. The electronic control enclosure of claim 1, wherein the enclosure housing further comprises a rear wall and wherein when the substrate is inserted into the enclosure housing, the electrical component is disposed near the rear wall.

6. The electronic control enclosure of claim 1, wherein the heat sink is mounted to the enclosure housing through the second wall.

7. The electronic control enclosure of claim 1, wherein the heat sink is integral with the enclosure housing.

8. The electronic control enclosure of claim 1, wherein the locator protrudes from the contact arm towards the second wall.

9. The electronic control enclosure of claim 1, wherein the spring is disposed proximate to the second wall.

10. The electronic control enclosure of claim 1, wherein the enclosure housing is made of a thermoplastic material.

11. The electronic control enclosure of claim 1, wherein the enclosure housing is made of metal.

12. The electronic control enclosure of claim 1, further comprising a header assembly coupled to the substrate and enclosing the enclosure housing.

13. The electronic control enclosure of claim 1, wherein the spring is coupled to the heat sink.

14. The electronic control enclosure of claim 1, wherein when the substrate is inserted into the enclosure housing such that the locator contacts the first surface, the locator deflects the substrate away from the contact arm.

15. The electronic control enclosure of claim 1, wherein the contact arm substantially extends along a length of the rear edge of the substrate.

16. The electronic control enclosure of claim 1, wherein the substrate is inserted into the enclosure housing in a direction substantially parallel with the second surface.

17. The electronic control enclosure of claim 1, wherein the contact arm is disposed generally perpendicular to the transition arm.

* * * * *

UNITED STATES PATENT AND TRADEMARK OFFICE
CERTIFICATE OF CORRECTION

PATENT NO. : 7,369,413 B2 Page 1 of 1
APPLICATION NO. : 11/716964
DATED : May 6, 2008
INVENTOR(S) : Caines et al.

It is certified that error appears in the above-identified patent and that said Letters Patent is hereby corrected as shown below:

Claim 1, Column 15, Line 53: "a enclosure" should be --an enclosure--.

Signed and Sealed this

Twelfth Day of August, 2008

JON W. DUDAS
*Director of the United States Patent and Trademark Office*